(12) United States Patent
Fujita et al.

(10) Patent No.: US 6,764,346 B2
(45) Date of Patent: Jul. 20, 2004

(54) FEATURE EXPANSION MODULE

(75) Inventors: Yasushi Fujita, Kanagawa (JP); Ryoji Sato, Kanagawa (JP); Fujio Noguchi, Tokyo (JP); Katsumi Endo, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/344,194

(22) PCT Filed: Jun. 6, 2002

(86) PCT No.: PCT/JP02/05616
§ 371 (c)(1),
(2), (4) Date: Apr. 23, 2003

(87) PCT Pub. No.: WO02/101640
PCT Pub. Date: Dec. 19, 2002

(65) Prior Publication Data
US 2003/0162445 A1 Aug. 28, 2003

(30) Foreign Application Priority Data
Jun. 8, 2001  (JP) ...................... 2001-174718

(51) Int. Cl.[7] .............................................. H01R 25/00
(52) U.S. Cl. ...................................... 439/638; 439/945
(58) Field of Search ................................ 439/638, 945, 439/946, 946.2, 76.1

(56) References Cited

U.S. PATENT DOCUMENTS

| | | | |
|---|---|---|---|
| 5,679,007 A | * 10/1997 | Potdevin et al. ........... | 439/76.1 |
| 5,820,414 A | 10/1998 | Omori | |
| 6,069,795 A | * 5/2000 | Klatt et al. ................ | 361/737 |
| 6,097,605 A | * 8/2000 | Klatt et al. ................ | 361/737 |
| 6,457,647 B1 | * 10/2002 | Kurihashi et al. .......... | 235/486 |
| 6,524,137 B1 | * 2/2003 | Liu et al. .................... | 439/638 |

FOREIGN PATENT DOCUMENTS

| | | |
|---|---|---|
| JP | 9-171863 A1 | 6/1997 |
| JP | 10-49268 A1 | 2/1998 |
| JP | 2001-76118 A1 | 3/2001 |

* cited by examiner

Primary Examiner—Gary Paumen
(74) Attorney, Agent, or Firm—Lerner, David, Littenberg, Krumholz & Mentlik, LLP

(57) ABSTRACT

A feature expansion module is provided which includes a generally rectangular body (11) installable in a host device (1), a first connection terminal (13) provided at one side of the body (11) for electrical connection with the host device (1), a feature expansion unit (44) provided inside the body (11) and having one or more functions, one or more recesses (22) formed contiguously to an insertion slot (23) formed at the other side of the body (11) and through which an integrated circuit chip (27) incorporating integrated circuit elements is inserted, to receive the integrated circuit chip (27), a second connection terminal (25) provided in the recess (22) for electrical connection with a group of terminals provided at the integrated circuit chip (27), and a controller (9) built in the body (11) to control the integrated circuit chip (27) set in the recess (22).

9 Claims, 17 Drawing Sheets

FEATURE EXPANSION MODULE

TECHNICAL FIELD

The present invention relates to a feature expansion module which implements one or more functions and is also connectable to a host device to work as an expansion module for the host device.

BACKGROUND ART

Conventionally, there is available a generally plate-like IC card formed to freely be removably installable in a host device such as a personal computer or the like and an information processing device such as a digital still camera or the like and including a semiconductor memory so that it is usable as an external storage. The IC card having a large storage capacity can record about 64 Megabytes of informative signals.

If such an IC card removably installable in the host-device such as a personal computer and having a first function which can be performed independently of the host device can be given a second function, the host device or IC card can have its functionality more extended and be used more conveniently.

Also, if the IC card can be designed to work as a memory and controller for a digital still camera or the like, the information processor itself can be designed more compact and lightweight to improve its portability.

DISCLOSURE OF THE INVENTION

Accordingly, the present invention has an object to overcome the above-mentioned drawbacks of the related art by providing a feature expansion module having a first function owned by an IC card removably installable in a host device and which can be performed independently of the host device, for example, and a second function which will be performed when an integrated circuit chip thereof is installed in place in the feature expansion module, to thereby extend the functionality of the IC card or the host device in which the IC card is installed.

The present invention has another object to provide a feature expansion module giving to a memory unit used as an external storage for an information processor a function to control the information processor and which thus permits to provide a more compact, lightweight and convenient information processor.

The above object can be attained by providing a feature expansion module according to the present invention including:

a generally rectangular body installable in a host device;

a first connection terminal provided at one side of the body to electrically be connected to the host device;

a feature expansion unit formed in the body and having one or more functions;

one or more recesses, formed contiguously to an insertion slot formed at the other side of the body and through which an integrated circuit chip incorporating integrated circuit elements is to be inserted, to receive the integrated circuit chip;

a second connection terminal provided in the recess to electrically be connected to a group of terminals provided on the integrated circuit chip; and a controller incorporated in the body to control the integrated circuit chip set in the recess.

Also the above object can be attained by providing a feature expansion module according to the present invention including:

a generally rectangular body installable in a host device;

one or more memory chips including an internal memory element;

a first connection terminal provided at one side of the body to electrically be connected to the host device;

a feature expansion unit formed in the body and having one or more functions;

one or more recesses, formed contiguously to an insertion slot formed at the other side of the body and through which the memory chip incorporating the memory element is to be inserted, to receive the memory chip;

a second connection terminal provided in the recess to electrically be connected to a group of terminals provided on the memory chip; and a controller incorporated in the body to control the memory chip set in the recess.

BEST MODE FOR CARRYING OUT THE INVENTION

The feature expansion module according to the present invention will be discussed in detail with reference to the accompanying drawings.

Figure 1:
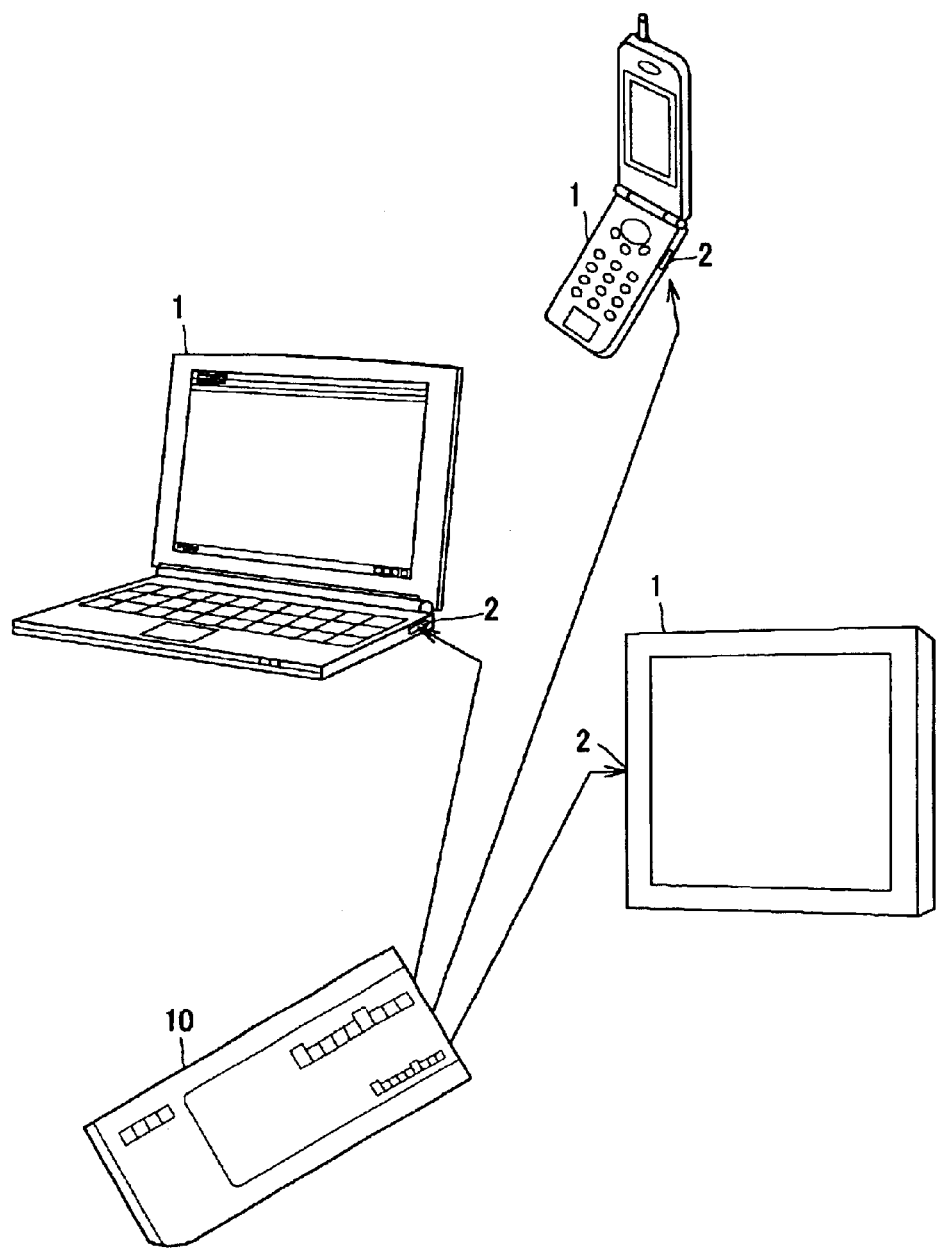
FIG. 1 is a perspective view of the feature expansion module according to the present invention, connectable to a variety of host devices.

Referring now to FIG. 1, there is schematically illustrated in the form of a perspective view the feature expansion module according to the present invention. The feature expansion module is indicated with a reference 10. The feature expansion module 10 is to be used as an external storage for a host device 1 such as a personal computer, PDA (portable digital assistant), mobile phone, audio apparatus or the like to store informative signals including data, picture data, video data, music data or the like to be processed by a computer. As shown in FIG. 1, the feature expansion module 10 is installed into the host device 1 through a feature expansion module insertion slot 2 formed in the host device 1 from and to which informative signals are recorded or reproduced by the host device 1. The feature expansion module 10 has a memory, and information recorded in the memory in the feature expansion module 10 is transmitted through the host device 1 or external information is received into the memory in the feature expansion module 10 through the host device 1.

Figure 2:
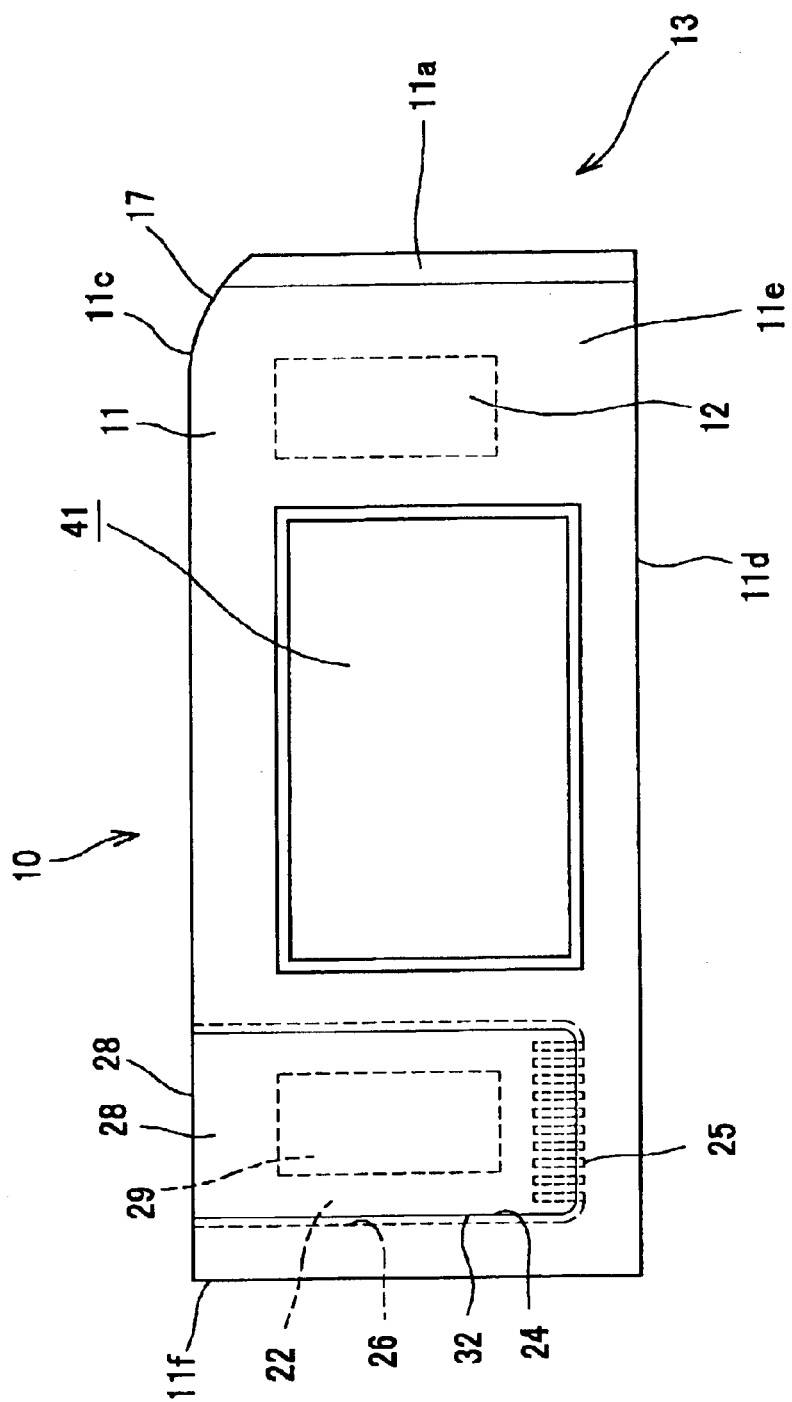
FIG. 2 is a plan view of the feature expansion module according to the present invention.
Figure 5:
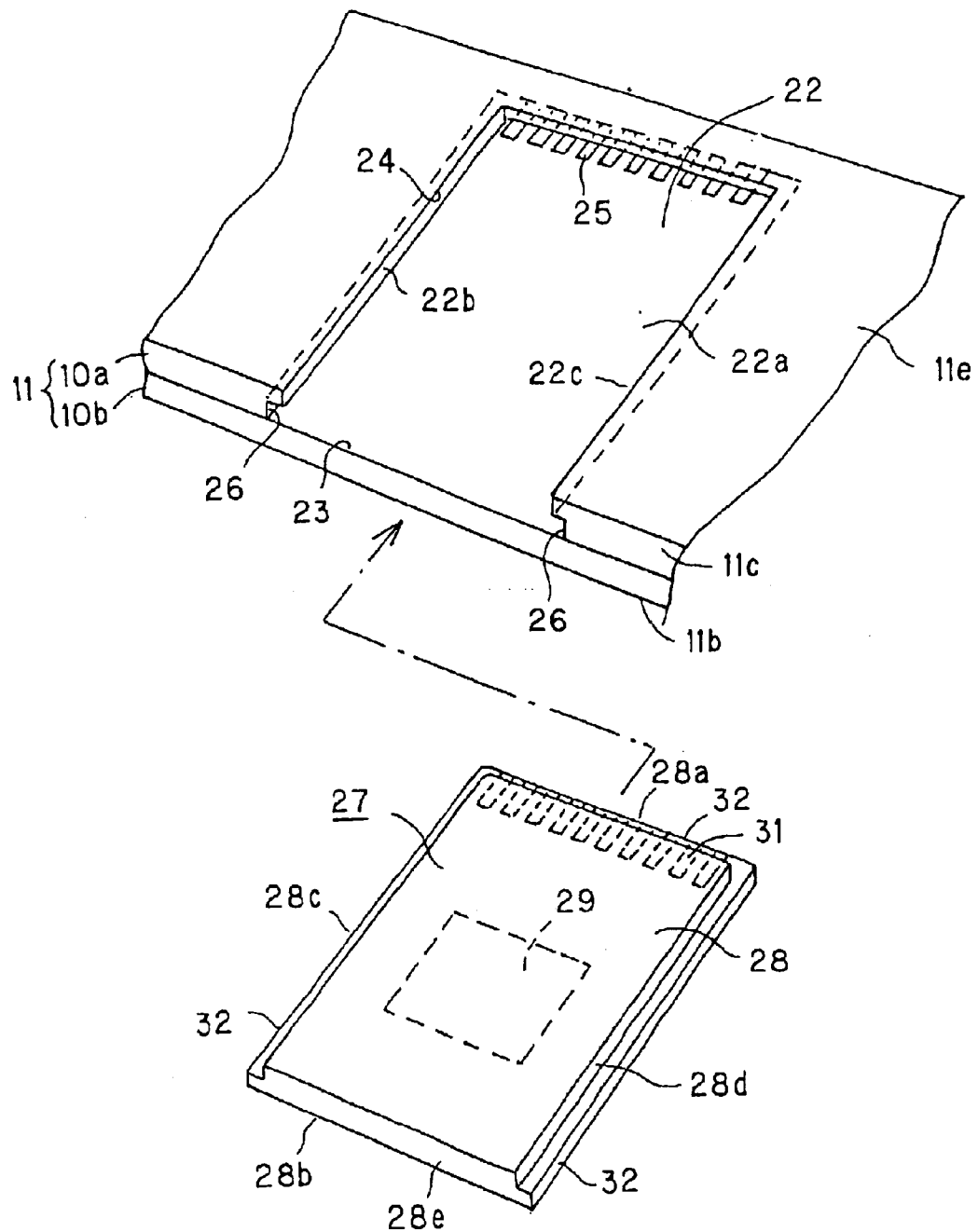
FIG. 5 is a perspective view of a memory chip to be received in the feature expansion module according to the present invention.

The feature expansion module 10 used as above receives an integrated circuit chip such as a memory chip or the like removably introduced from one end thereof as shown in FIGS. 2 and 5.

Figure 3:
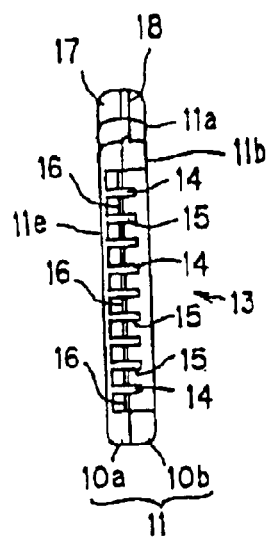
FIG. 3 is a side elevation of the feature expansion module according to the present invention.
Figure 4:
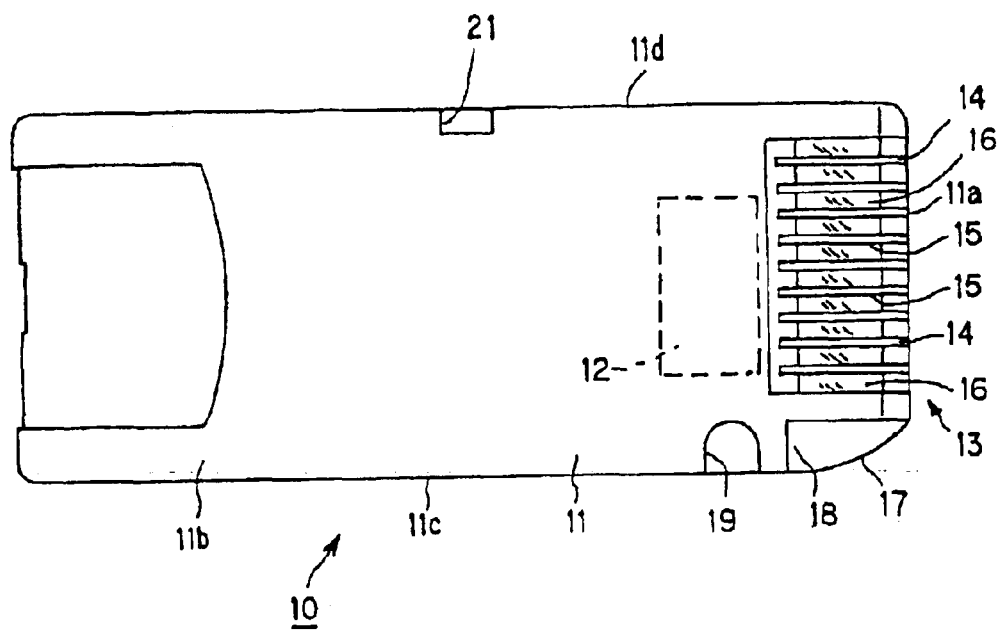
FIG. 4 is a bottom view of the feature expansion module according to the present invention.

As shown in FIGS. 2, 3 and 4, the feature expansion module 10 has a housing 11 formed from an upper half 10a and lower half 10b and which provides the body of the feature expansion module 10. The upper and lower halves 10a and 10b forming together the housing 11 are molded from a rigid synthetic resin.

The housing 11 formed from the above upper and lower halves 10a and 10b coupled to each other has built therein a semiconductor device 12 in which a controller 9 is formed to write informative signals to the memory chip and read informative signals from a control circuit 44 (will be best seen in FIG. 6) which implements unique functions of the memory chip or the feature expansion module 10. Also, the housing 11 is formed to have a mechanical strength with which it will not be bent under an ordinary external force or the like applicable during use of the feature expansion module 10, to protect the internal semiconductor device 12.

A terminal block 13 is provided over the front one (front end face 11a) of shorter sides and bottom side 11b of the housing 11. The terminal block 13 has as many engagement concavities 15 defined between partitions 14 as terminal electrodes and in which a group of terminals provided at the host device 1 is engaged. A plurality of electrodes 16 isolated by the partitions 14 from each other is provided on the bottoms of the engagement concavities 15. Since the electrode 16 is provided on the bottom of the engagement concavity 15, the engagement concavity 15 protects the electrode 16 by preventing it from being directly touched by the finger or the like. In the housing 11, there are provided ten electrodes 16. Data is transferred between the feature expansion module 10 and host device 1 through the electrodes 16 of the terminal block 13 via a serial interface. More specifically, the plurality of electrodes 16 includes at least an input terminal for serial protocol bus state signal BS, input terminal for serial protocol data signal SDIO and an input terminal for serial clock SCLK, and a terminal for a supply voltage VCC and reserved terminal as well.

At the front 11a where the terminal block 13 is formed, the housing 11 is chamfered (at a reference 17) at one of four corners thereof for such a purpose that the user can easily identify the direction of insertion into the host device 1. On one lateral side face 11c of the housing 11, where the chamfer 17 is formed, there is formed an incorrect-insertion preventive cut-out 18 open at the bottom side 11b and contiguous to the chamfer 17. The chamfer 17 and incorrect-insertion preventive cut-out 18 will work together to limit the direction of the feature expansion module 10 being introduced into the host device 1, to thereby prevent the feature expansion module 10 from being incorrectly inserted into the host device 1. That is, when the feature expansion module 10 is not normally introduced through the insertion slot 2, the chamfer 17 and incorrect-insertion preventive cut-out 18 will prevent the electrodes 16 from being put into contact with the terminal group of the host device 1 by blocking the electrodes 16 and terminal group of the host device 1 from being engaged into the engagement concavities 15 defined between the partitions 14.

Also, in the lateral side face 11c of the housing 11 and rather near to the front end face 11a, there is formed a disengagement preventive concavity 19 open at the bottom side 11b. When the feature expansion module 10 is introduced into the host device 1, an elastic engagement piece provided at the host device 1 is engaged into the disengagement preventive concavity 19 to prevent the feature expansion module 10 from being disengaged from the host device 1. Also, generally in the center of the other lateral side face 11d of the housing 1, there is formed an engagement concavity 21 open at the bottom side 11b and into which an ejection mechanism provided at the host device 1 is to be engaged.

In addition, the housing 11 has provided therein nearer to a rear side 11f thereof a recess 22 in which a memory chip 27 is to be removably installed, as shown in FIGS. 2 and 5. The recess 22 consists of an insertion slot 23 formed in the one lateral side face 11c of the upper half 10a of the housing 11 and an opening 24 formed in the upper half 10a of the housing 11 contiguously to the insertion slot 23 and nearly to an upper side 11e of the housing 11. The memory chip 27 can be introduced into, or removed from, the recess 22 by the finger or the like. The recess 22 is formed to have the same dimensions as the memory chip 27 so that the memory chip 27 once introduced in the recess 22 will be flush at a rear end face 28e thereof exposed in the opening 24 with the lateral side face 11c of the housing 11. Thus, in this feature expansion module 10, the memory chip 27 once introduced in the recess 22 will not project at the rear end thereof from the lateral side face 11c of the housing 11. Namely, the feature expansion module 10 can smoothly be installed into or removed from the host device 1 and will feel smooth when held in hand.

The recess 22 has a bottom 22a which guides the memory chip 27 being introduced or ejected, and also connection terminals 25 provided on an innermost wall thereof for electrical connection with the memory chip 27 once inserted in place. In addition, the recess 22 has a guide concavity 26 formed on each of a lateral wall 22b parallel to the direction of inserting the memory chip 27 and a lateral wall 22c the insertion end of the memory chip 27 going to be introduced will abut. The guide concavity 26 guides the memory chip 27 being introduced or ejected while providing a well-defined position for the memory chip 27 to be received in the recess 22.

As shown in FIG. 5, the memory chip 27 to be received in the above-mentioned recess 22 includes a generally rectangular chip body 28 having generally same dimensions as the recess 22 and molded from the same material as that of the housing 11. The chip body 28 has built therein one or more flash memories 29 being a semiconductor memory. The flash memory 29 has a storage capacity of any of 4, 8, 16, 32, 64, 128 MB, . . . , for example.

The chip body 28 has a plurality of terminals 31 provided at a bottom side 28b thereof at a front end face 28a, that is, the end for the first insertion into the recess 22, and which are to be electrically connected with the connection terminals 25 provided in the recess 22. When the terminals 31 are electrically connected to the connection terminals 25 in the recess 22, data is written to or read from the flash memory 29 under the control of the controller 9 formed in the semiconductor device 12 provided in the housing 11.

The chip body 28 has provided thereon insertion guides 32 projecting from a front end face 28a thereof and both lateral side faces 28c and 28d adjacent to the front end face 28a, respectively, along a bottom side 28b thereof to guide the memory chip 27 being introduced into or removed from the recess 22. The insertion guides 32 are engaged into the guide concavities 26 formed in the recess 22 to guide the memory chip 27 being introduced into or removed from the recess 22.

Note that the recess 22 may have provided near the insertion slot 23, for example, a disengagement preventive member to prevent the memory chip 27 once received in the recess 22 from being disengaged from there. Also, the number of the recess 22 is not limited to one but more recesses 22 may be provided. In this case, the feature expansion module 10 can receive a plurality of memory chips to have an increased storage capacity. Further, the feature expansion module 10 may also receive an integrated circuit chip having a function other than that of the memory chip to attain a multi-functionality of the feature expansion module 10.

A variety of data is recorded to the memory chip 27 under the control of the control circuit 44 which implements the unique functions of the feature expansion module 10, which will be described in detail later. Also, various kinds of data recorded to the memory chip 27 when the feature expansion module 10 is installed in the host device 1 are processed by an application program put into run by the controller in the host device 1. Further, various data having been processed by the host device are recorded to the memory chip 27. That is, the feature expansion module 10 also works as an external storage for the host device 1.

Figure 6:
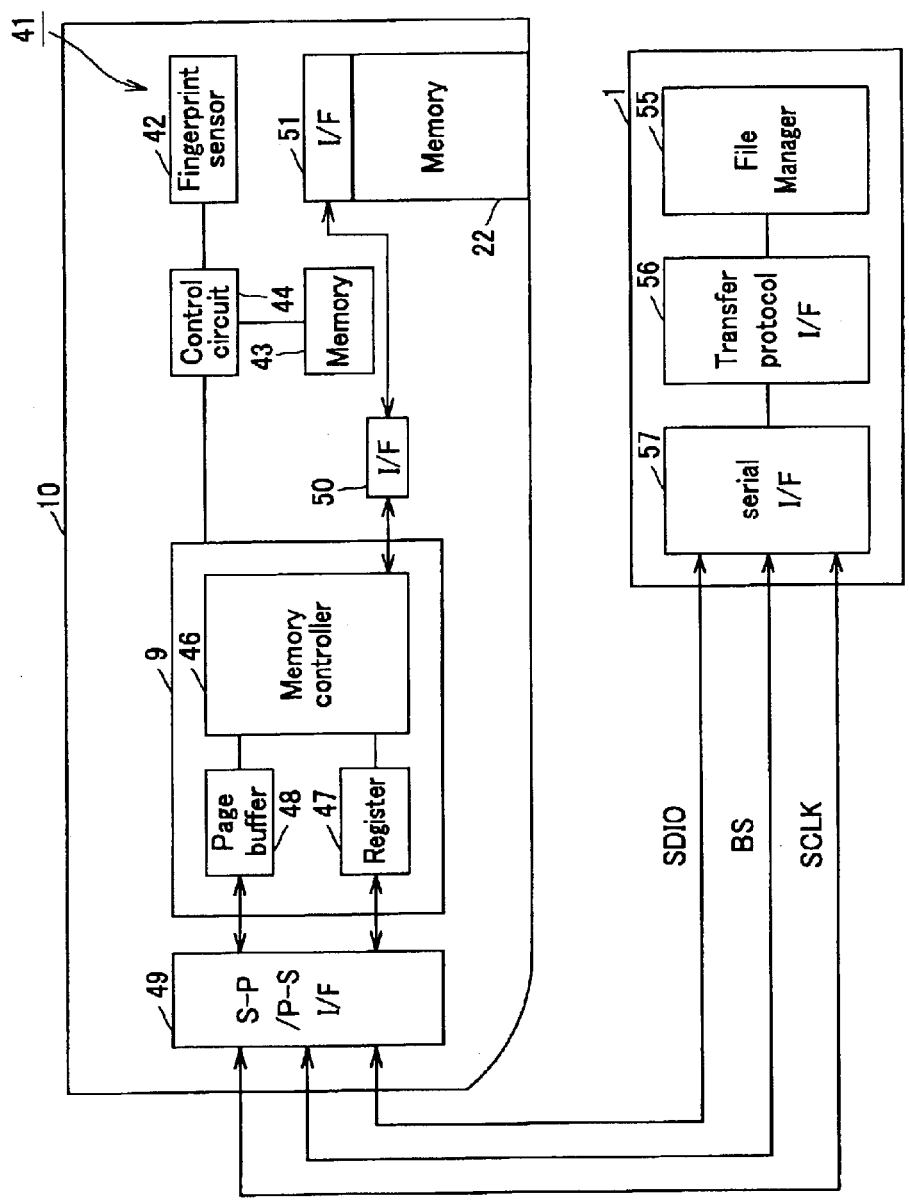
FIG. 6 shows the circuit configuration of the feature expansion module with a fingerprint detecting function.

The above feature expansion module 10 has one or more unique functions independent of the host device 1. For example, the feature expansion module 10 has provided on a top 11e of the housing 11 a fingerprint detector 41 to detect the fingerprint of the user when the user presses the fingertip to the fingerprint detector 41, as shown in FIGS. 2 and 6. The fingerprint detector 41 includes a fingerprint sensor 42 to which the user presses the fingertip, a memory 43 having stored therein fingerprint data and information related to the fingerprint data, and the control circuit 44 to check input fingerprint data with the registered fingerprint data. The feature expansion module 10 incorporates a printed wiring board which has mounted thereon one or more semiconductor devices including the fingerprint sensor 42, memory 43 and control circuit 44. The fingerprint detector 41 transfers an authentication signal to and from the host device 1 through a serial-parallel/parallel-serial interface 49 via the controller 9 of the feature expansion module 10.

Using the fingerprint detector 41, the feature expansion module 10 can detect whether the user of the host device 1 is a one pre-registered in the memory 43, and limit the access to a specific file stored in the host device 1 and to a specific web site via a network by sending an authentication or non-authentication signal to the host device 1. Also, connected to the host device 1, the feature expansion module 10 can make a fingerprint checkup with a pre-registered one during an electronic commerce or the like to prevent any illegal electronic commerce on the network.

Next, the feature expansion module 10 and the host device 1 in which the feature expansion module 10 is to be installed will be described concerning their circuit configurations.

First, the circuit configuration of the feature expansion module 10 will be described. As shown in FIG. 6, the controller 9 included in the semiconductor device 12 provided in the housing 11 of the feature expansion module 10 includes a memory controller 46 to control data write to or data read from the flash memory 29 of the memory chip 27, a register 47 having stored therein various parameters for the data write or read, a page buffer 48 to store data temporarily, and the serial-parallel/parallel-serial (S-P/P-S) interface 49 for use to transfer data to and from the host device 1. Further, in the housing 11 forming the body of the feature expansion module 10, there is provided a chip interface 50 for use to transfer data between the flash memory 29 of the memory chip 27 and controller 9 in the housing 11. The chip interface 50 enables data transfer to and from the controller 9 when the memory chip 27 is received in the recess 22.

Also, the memory chip 27 removably receivable in the housing 11 includes one flash memory 29, and a chip interface 51 for connection to the chip interface 50 to transfer data to and from the controller 9.

Next, the circuit configuration of the host device 1 will be described. As also shown in FIG. 6, the host device 1 includes a file manager 55 for file management of the feature expansion module 10, a transfer protocol interface 56 for access to the register 47 and page buffer 48 in the controller 9 of the feature expansion module 10, and a serial interface 57 to define a protocol for data transfer over three signal lines, namely, serial clock SCLK, bus state BS and serial data input/output SDIO. The file manager 55 is an application program implemented when it is executed by the controller such as a CPU in the host device 1.

Next, the circuit configuration of the fingerprint detector 41 of the feature expansion module 10 will be described. As previously described, the fingerprint detector 41 includes the fingerprint sensor 42 to which the user presses the fingertip, memory 43 having stored therein pre-registered fingerprint data and information related to the fingerprint data, and the control circuit 44 to check fingerprint data supplied from the fingerprint sensor 42 with the fingerprint data stored in the fingerprint memory 43.

The fingerprint sensor 42 includes an imaging device such as a CCD (charge coupled device), line sensor and the like, a back light to illuminate a touch area thereof, etc. When the fingertip is pressed to the touch area of the fingerprint sensor 42, the back light is turned on and a fingerprint is captured by the imaging device. The fingerprint sensor 42 extracts fingerprint features such as branches and center of the skin ridge from the captured fingerprint. For registration of the fingerprint, the fingerprint sensor 42 supplies fingerprint data characteristic of the fingerprint to the memory 43. The memory 43 stores such fingerprint data characteristic of a to-be-registered fingerprint along with a unique number (identification number). Also, for each fingerprint checkup, the fingerprint sensor 42 supplies such fingerprint data to the control circuit 44.

Also, additionally to the fingerprint data, the memory 43 stores information related to the registered fingerprint data. More specifically, the related information stored in the memory 43 includes the name of a person whose fingerprint has been registered, ID number, serial number of the feature expansion module 10, etc. When the control circuit 44 has recognized the fingerprint, the memory 43 delivers the data on the authenticated user along with the authentication number to the S-P/P-S interface 49 through the control circuit 44.

The control circuit 44 controls the entire fingerprint detector 41. For example, when a fingertip is pressed to the fingerprint sensor 42, the control circuit 44 drives the fingerprint sensor 42 and controls write of fingerprint data and related information for registration to the memory 43 and read of the related information from the memory 43. Also, for checkup of the fingerprint of a user, the control circuit 44 checks fingerprint data supplied from the fingerprint sensor 42 with fingerprint data stored in the memory 43 to recognize the user. When the control circuit determines that the fingerprint data supplied from the fingerprint sensor 42 is coincident with the fingerprint data read from the memory 43 and thus authenticates the user, it delivers an authentication signal to the S-P/P-S interface 49. On the contrary, when the fingerprint data supplied from the fingerprint sensor 42 is not found coincident with the fingerprint data read from the memory 43, namely, when the user is not authenticated, the control circuit 44 delivers a non-authentication signal to the S-P/P-S interface 49.

The aforementioned feature expansion module 10 is used as will be described below. First, registration or entry of the fingerprint of a user in the fingerprint detector 41 of the feature expansion module 10 will be explained. As the user operates the host device 1 or the like, the control circuit 44 of the feature expansion module 10 will be supplied with a command from the host device 1 and shifts to a fingerprint registration mode. Next, when the user presses the fingertip to the fingerprint sensor 42, the control circuit 44 detects it by the fingerprint sensor 42, captures the fingerprint of the user by the imaging device, extracts fingerprint features such as branches and center of the skin ridge from the captured fingerprint to generate fingerprint data. Then the control circuit 44 assigns an identification number to the fingerprint data and supplies the fingerprint data to the memory 43. Thus, the memory 43 will store or register the fingerprint data on the user.

Note that at this time, the memory 43 can store information related to the fingerprint data to be registered. That is, operating keyboard 3 or mouse 5 at the host device 1, the user can enter his or her name and ID number (name and ID number of a person whose fingerprint is to be registered) and record the input data to the memory 43 of the feature expansion module 10 via the S-P/P-S interface 49.

Next, how a fingerprint is checked up will be explained. When the user tries access to a specific computer or to a specific file stored in a hard disc 51 by operating the keyboard 3 or mouse 5 as the operating device for the host device 1, the host device 1 for example will request the user for an authentication by the fingerprint checkup.

Upon the request from the host device 1, the user presses the fingertip to the fingerprint sensor 42 of the feature expansion module 10. Then, the control circuit 44 will detect it by the fingerprint sensor 42, captures the fingerprint of the user by the imaging device, extracts fingerprint features such as branches and center of the skin ridge from the captured fingerprint to generate fingerprint data. Also the control circuit 44 reads registered fingerprint data from the memory 43, and checks it with fingerprint data generated by the fingerprint sensor 42. Then when the control circuit 44 determines that the fingerprint data generated by the fingerprint sensor 42 is coincident with the fingerprint data read from the memory 43 and thus authenticates the user, it delivers an authentication signal to the S-P/P-S interface 49 via the controller 9. Also the control circuit 44 supplies the related information on the authenticated user to the S-P/P-S interface 49. Upon reception of the authentication via the serial interface 57, the host device 1 allows the user to access a specific computer, web site and a specific file stored in the hard disc.

On the contrary, when the control circuit 44 has not determined that the fingerprint data generated by the fingerprint sensor 42 is coincident with the fingerprint data read from the memory 43 and thus does not authenticate the user, it will deliver a non-authentication signal to the S-P/P-S interface 49. Upon reception of the non-authentication signal via the mouse 5, the host device 1 will inhibit the user from accessing any specific computer, web site and any specific file stored in the hard disc.

Next, how the memory chip 27 is installed to or removed from the housing 11 of the feature expansion module 10 will be described. The memory chip 27 is inserted first at the front end 28a thereof provided with the terminals 31 from the insertion slot 23 formed in the lateral side face 11c of the housing 11 of the feature expansion module 10 into the recess 22. For this introduction, the memory chip 27 is inserted into the recess 22 from the insertion slot 23 with the guides 32 of the chip body 28 being engaged in the guide concavities 26 in the recess 22. Therefore, the user can smoothly insert the memory chip 27 in the recess 22. When the memory chip 27 is completely inserted into the recess 22, the terminals 31 are put into contact with the connection terminals 25 in the recess 22 so that the chip interface 51 at the memory chip 27, shown in FIG. 6, will be connected to the chip interface 50 at the housing 11.

When the memory chip 27 is completely inserted in the recess 22, the rear end face 28e of the chip body 28 of the memory chip 27 will be generally flush with the lateral side face 11c of the housing 11 in which the insertion slot 23 is formed. Thus, the feature expansion module 10 can be inserted into the host device 1 and will feel smooth when held in hand.

Note that more than one recess 22 may be formed in the housing 11 and in this case a plurality of memory chips 27 having the same storage capacity or different storage capacities may be received in the recesses 22, respectively. Therefore, the user can freely change the whole storage capacity of the feature expansion module 10 according to an intended use.

Also, by installing the memory chip 27 having stored therein a plurality of fingerprint data and information related to the fingerprint data in the feature expansion module 10, it is possible to check fingerprints of a plurality of persons or users. In this case, the memory chip 27 sends fingerprint data of the plurality of persons to the control circuit 44 via the chip interfaces 50 and 51. Thus, just by replacing a memory chip 27 with another, the feature expansion module 10 can check fingerprints of a plurality of persons. Namely, one host device 1 and feature expansion module 10 can be used commonly by the plurality of persons.

Further, the user can use memory chips 27 having stored therein data different kinds of data, respectively. Namely, one of the memory chips stores music data and image data while the other stores data to be processed by the computer, for example. A desired one may be selected from the memory chips 27 for installation in the recess 22 when only one recess 22 is formed in the housing 11 or the memory chips 27 may be inserted in the plurality of recesses 22, respectively, if applied. Thus, the user can easily manage data.

Also, the memory chip 27 can easily be removed from the housing 11 by sliding it toward the insertion slot 23 with the finger being applied to the exposed portion of the memory chip 27 in the opening 24.

The feature expansion module 10 having the memory chip 27 set in the recess 22 as above is introduced first at the front end face 11a of the housing 11 where the terminal block 13 into the insertion slot 2 of the host device 1 as shown in FIG. 1. For facilitating this introduction, the housing 11 has the chamfer 17 and incorrect-insertion preventive cut-out 18 formed at the front end face 11a. Therefore, if it is tried to introduce the feature expansion module 10 in any position other than normal, for example, in an inverted position, into the insertion slot 2 of the host device 1, the feature expansion module 10 will be blocked from being inserted, whereby it is possible to prevent the feature expansion module 10 from being incorrectly inserted. When the feature expansion module 10 is normally inserted into the receptacle in the host device 1 with the elastic engagement piece or the like provided at the host device 1 being engaged into the disengagement preventive concavity 19, it can securely be set in the receptacle whereby the feature expansion module 10 can be prevented from being disengaged from the host device 1.

When the feature expansion module 10 is thus set in the host device 1, the terminal group of the host device 1 is put into contact with the electrodes 16 and the S-P/P-S interface 49 of the feature expansion module 10 is connected to the serial interface 57 of the host device 1 as shown in FIG. 6. Then, the S-P/P-S interface 49 is supplied with serial protocol bus state bus BS and serial clock SCLK from the host device 1. After receiving an authentication signal from the fingerprint detector 41, the controller such as a CPU to control the entire host device 1 will implement the file manager 55 by executing a corresponding application program, and the file manager 55 will read data such as file name, data size, etc. from the flash memory 29 of the memory chip 27 set in the recess 22 in the housing 11.

For writing data to the flash memory 29 of the memory chip 27, the file manager 55 updates itself while delivering data to the feature expansion module 10 via the transfer protocol interface 56 and serial interface 57. Based on a control signal from the file manager 55, the memory controller 46 temporarily stores data input from the host device 1 into the page buffer 48 via the S-P/P-S interface 49 according to the serial protocol bus state signal BS and serial clock SCLK, and then stores the data into the flash memory 29 of the memory chip 27 set in the recess 22 at a specified address via the chip interfaces 50 and 51.

Note that for reading data from the flash memory 29 of one, at a specified address, of a plurality of memory chips 27 set in a plurality of recesses 22, the memory controller 46 will be based on the control signal from the file manager 55 to read data from the flash memory 29 of the specified memory chip 27 according to the serial protocol bus state signal BS and serial clock SCLK, temporarily store it into the page buffer 48 and then deliver it to the host device 1 via the S-P/P-S interface 49. Then, the file manager 55 reads data through the serial interface 57 and transfer protocol interface 56.

Also note that the feature expansion module 10 set in the receptacle in the host device 1 is ejected out of the housing 111 through the insertion slot 2 by the ejection mechanism engaged in the engagement concavity 21 of the housing 11.

Also, the memory chip 27 is independently usable as an external storage for the host device 1. In this case, the housing 11 forming the body of the feature expansion module 10 serves as an adapter for the host device 1 to read or write data from or to the memory chip 27 when the latter cannot be set directly in the receptacle in the host device 1.

The user can change the whole storage capacity of the aforementioned feature expansion module 10 just by replacing the memory chip 27 with another. Thus, the user can advantageously select a storage capacity of the feature expansion module 10 for an intended use. In case the feature expansion module 10, namely, the housing 11, has a plurality of recesses 22 formed therein, the user can use the feature expansion module 10 conveniently in various manners. For example, it is possible to store music data an image data in the memory chip 27 set in the recess 22 at the first address while storing data to be processed by the computer in the memory chip 27 set in the recess 22 at the second address. Therefore, the user can easily manage data. Further, when a further memory is required, the user has only to buy an additional memory chip 27, which will lead to less expenses.

Also, with the memory chip 27 having stored therein fingerprint data on a plurality of persons being set in the recess 22, the feature expansion module 10 can check fingerprints of the persons and thus one host device 1 and feature expansion module 10 can be used commonly by the persons.

Note that the feature expansion module 10 may be designed to receive an integrated circuit chip other than the memory chip 27 in the recess 22 formed in the housing 11. When an integrated circuit chip other than the memory chip 27 is set in the housing 11 serving as an adapter, the feature expansion module 10 itself will work as a feature expansion unit for the host device or information processor.

Also, since the feature expansion module 10 can receive, in the recess 22 thereof, an integrated circuit chip such as the memory chip 27 or the like not fitting the insertion slot 2 of the host device 1 for the feature expansion module 10, even an integrated circuit chip not complying with the standard applied to the insertion slot 2 can be connected to the host device 1.

Next, a feature expansion module having a digital camera function installed therein will be described. This feature expansion module is indicated with a reference 70. Note that of this feature expansion module 70, the same mechanisms and parts as in the feature expansion module 10 with the aforementioned fingerprint detector will be indicated with the same references as for the mechanisms and parts of the feature expansion module 10 and will not be described any more.

Figure 7:
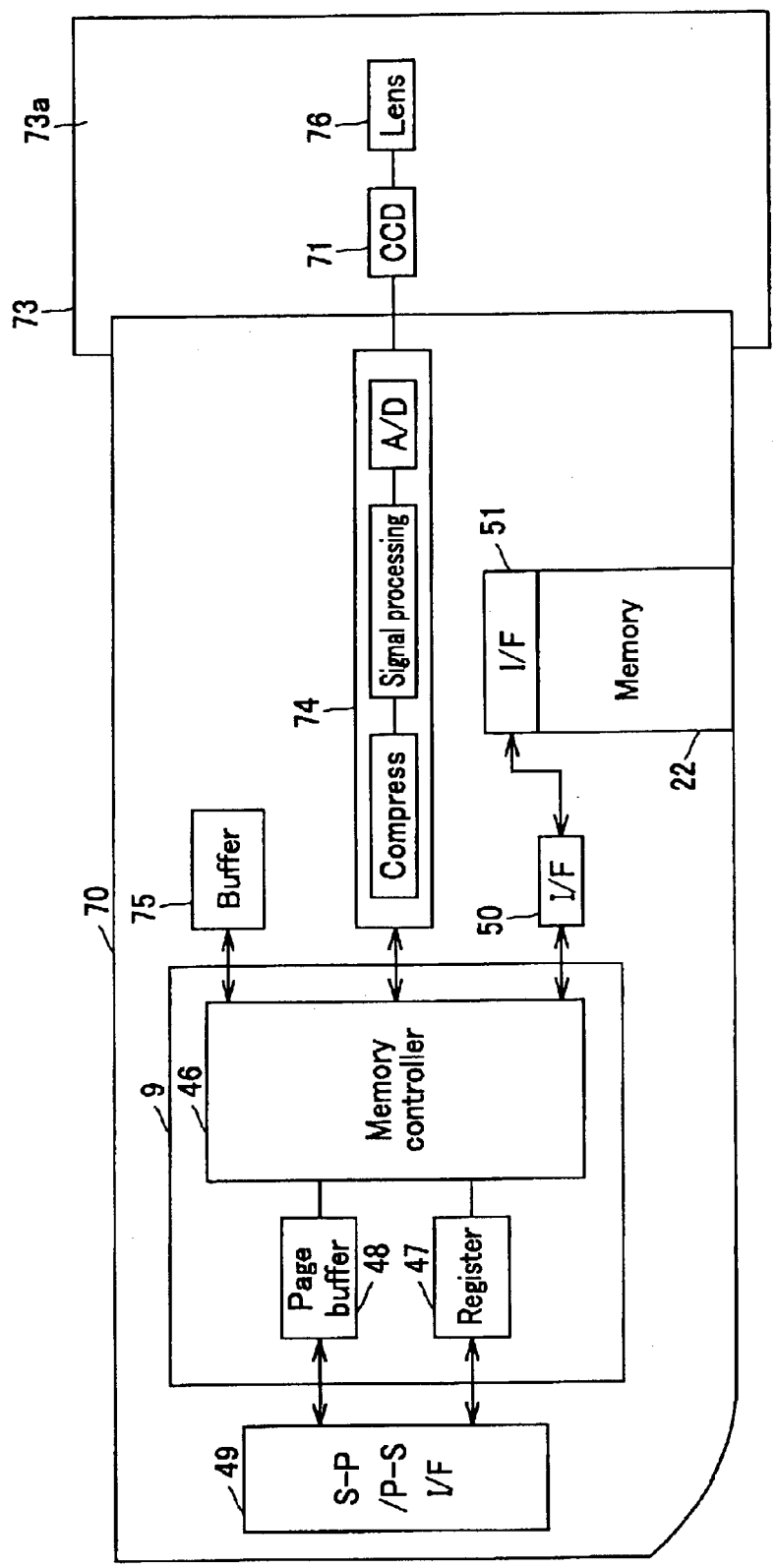
FIG. 7 shows the circuit configuration of the feature expansion module with a camera function.

Referring now to FIG. 7, there is schematically illustrated the circuit configuration of the feature expansion module 70. As shown, the feature expansion module 70 is formed to have the same shape as the aforementioned feature expansion module 10. The feature expansion module 70 has formed at one end thereof the recess 22 in which an integrated circuit chip such as the memory chip 27 or the like is removably installed. Also, the feature expansion module 70 includes the housing 11 formed from upper and lower halves coupled by butting them, and the semiconductor device 12 including the memory chip 27 and controller 9 which reads and write informative signals from and to a control circuit 74 which will be described in detail later. Further, the feature expansion module 70 has the terminal block 13 formed over the front end face 11a and bottom side 11b, and transfers data to and from the host device 1 through the electrodes 16 of the terminal block 13 via a serial interface.

The feature expansion module 70 includes an imaging unit 73 removably installed on the rear side 11f of the housing 11 and formed from an imaging device such as a CCD 71 or the like, the control circuit 74 to send picture signal captured by the imaging unit 73 to the host device 1 and store the data into the memory chip 27, and a buffer 75 to store video signals generated by the control circuit 74. Thus, the feature expansion module 70 functions as a digital camera independently of the host device 1. Also, with the feature expansion module 70 being connected to the host device 1 with an image display via the terminal block 13 with the imaging unit 73 being removed therefrom, a captured image can be displayed on the image display of the host device 1. That is, the feature expansion module 70 can serve as an external storage for the host device 1.

The imaging unit 73 to capture an image is installed on the rear side 11f of the housing 11, and includes a generally rectangular housing 73a, pickup lens 76 provided inside the housing 73a, and a CCD (charge coupled device) device 71 to generate video signal. The control circuit 74 to process picture signal captured by the imaging unit 73 includes an A/D converter to convert picture signal captured by the imaging unit 73 into digital signal, a signal processor to process digital signal for each color coding, compressor to compress the processed picture signal, etc. The buffer 75 temporarily stores the video signals generated by the control circuit 74 is connected to the controller 9 of the feature expansion module 70, and can send the picture signal to the host device 1 via the S-P/P-S interface 49 and store the video data into the memory chip 27 set in the recess 22.

Next, how the feature expansion module 70 takes a picture will be explained. A picture signal from the CCD device 71 of the imaging unit 73 is color-coded by color coding filters for primary colors (R, G and B) or complimentary colors (Ye, Cy and Mg), delivered to the A/D converter of the control circuit 74, converted into digital video data and then delivered to the signal processor. The output video data is decoded for each color coding by the color coding filters of the CCD device 71 to produce brightness information, color-difference information, etc. The decoded video data is compressed in the JPEG (Joint Photographic Experts Group) form for example, and supplied to the buffer 75. Also, the video data compressed in the JPEG form is transferred by the controller 9 to the host device 1 via the S-P/P-S interface 49, and also to the memory chip 27 via the chip interface 50.

The feature expansion module 70 can have an increased storage capacity just by replacing the memory chip 27 with any other larger-capacity one even when the video data going to be stored into the memory chip 27 is too large in size for storage into the memory chip 27.

Also, the feature expansion module 70 can avoid a mixture of video data of different kinds from being mixed in one memory chip by replacing the memory chip with another for each difference between video data in date, location or the like of picture data acquisition. Thus, the feature expansion module 70 can easily manage data.

Having the imaging unit 73 installed in the feature expansion module 70 having the memory chip 27 already set therein, the feature expansion module 70 can function as a digital still camera independently of the host device 1. Since the memory chip 27 and control circuit 74 are formed inside the housing 11 of the feature expansion module 70, it is possible to design the housing 73a of the imaging unit 73 compact and lightweight, and thus improve the portability.

Further, by installing the feature expansion module 70 with the imaging unit 73 removed therefrom in the host device 1 with the image display, the feature expansion module 70 can transfer video data compressed in the JPEG form to the host device 1 and display it on the image display of the host device 1. That is, the feature expansion module 70 can also be used as an external storage for the host device 1.

Also, since the feature expansion module 70 can receive, in the recess 22 thereof, an integrated circuit chip such as the memory chip 27 or the like not fitting the insertion slot 2 of the host device 1 for the feature expansion module 70, even an integrated circuit chip not complying with the standard applied to the insertion slot 2 can be connected to the host device 1.

Note that the feature expansion module 70 may have a recess 22 formed in the housing 73a of the imaging unit 73 for receiving an integrated circuit chip such as the memory chip 27 or the like.

Next, a feature expansion module having a GPS (global positioning system) function installed therein will be described. This feature expansion module is indicated with a reference 90. Note that of this feature expansion module 90, the same mechanisms and parts as in the feature expansion module 10 with the aforementioned fingerprint detector will be indicated with the same references as for the mechanisms and parts of the feature expansion module 10 and will not be described any more.

Figure 8:
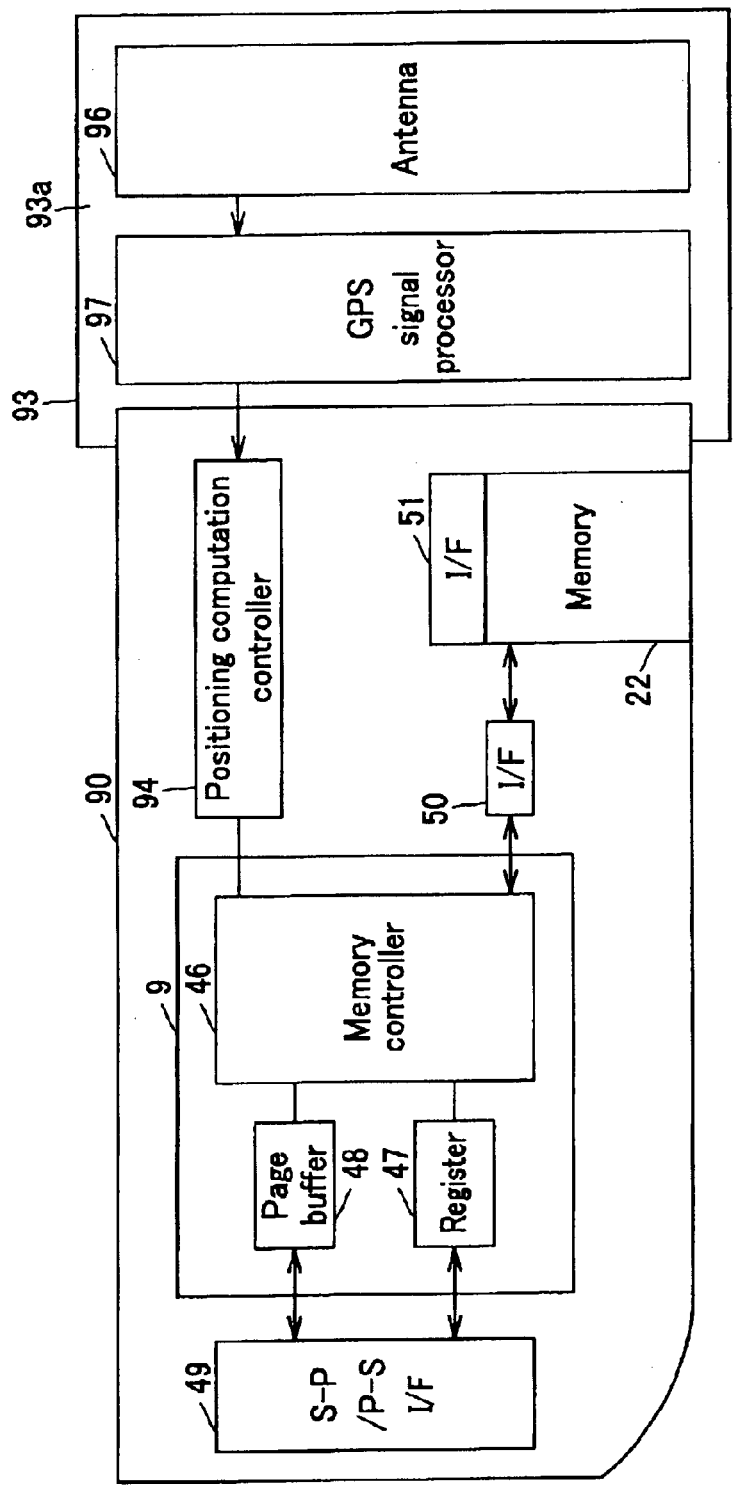
FIG. 8 shows the circuit configuration of the feature expansion module with a GPS (global positioning system) function.

Referring now to FIG. 8, there is schematically illustrated the circuit configuration of the feature expansion module 90. As shown, the feature expansion module 90 is formed to have the same shape as the aforementioned feature expansion module 10. The feature expansion module 90 has formed at one end thereof the recess 22 in which an integrated circuit chip such as the memory chip 27 or the like is removably installed. Also, the feature expansion module 90 includes the housing 11 formed from upper and lower halves coupled by butting them, and the semiconductor chip 12 built in the housing 11 and including the memory chip 27 and controller 9 which reads position data including latitude and longitude information and the like from a positioning computation controller 94 which will be described in detail later, sends it to the host device 1 and stores it into the memory chip 27. Further, the feature expansion module 90 has the terminal block 13 formed over the front end face 11a and bottom side 11b of the housing 11 and which transfers data to and from the host device 1 through the electrodes 16 of the terminal block 13 via the S-P/P-S interface 49.

The feature expansion module 90 includes a receiver 93 removably installed on the rear side 11f of the housing 11 and including parts such as GPS antenna 96, and the positioning computation controller 94 to detect user's position from GPS signals supplied from the receiver 93. Thus the feature expansion module 90 functions as a GPS receiver independently of the host device 1. Also, with the feature expansion module 90 being connected to the host device 1 with an image display via the terminal block 13 with the receiver 93 removed therefrom, the current position of the feature expansion module 90 can be displayed on the image display of the host device 1. That is, the feature expansion module 90 can expand the function of the host device 1.

The receiver 93 receives radio waves from GPS satellites. It includes the antenna 96 and a GPS signal processor 97 to make digital processing of GPS signals coming from the antenna 96. The GPS signal processor 97 converts the frequencies of each of the GPS signals received from the plurality of GPS satellites, and then sends each GPS signal to the positioning computation controller 94. The positioning computation controller 94 detects the position of the feature expansion module 90 based on the received GPS signals.

More particularly, the GPS antenna 96 receives radio waves each including an accurate time signal from a plurality of GPS satellites, and the GPS signal processor 97 modulates and otherwise processes the received signal to reproduce the time signals and supplies the time signals to the positioning computation controller 94 including a position detection circuit.

The positioning computation controller 94 measures a distance to each of the GPS satellites on the basis of the time signal and detects the latitude and longitude of the feature expansion module 90. The latitude and longitude can be determined as points of intersection among spheres whose radii are the measured distances to the GPS satellites and centers are absolute positions of the GPS satellites. The positioning computation controller 94 supplies the latitude and longitude information of the feature expansion module 90 to the controller 9.

When the feature expansion module 90 is installed in the host device 1 with the image display, the controller 9 will send the latitude and longitude information to th host device 1 via the S-P/P-S interface 49. The host device 1 having received the latitude and longitude information displays the present position of the feature expansion module 90 on the image display thereof. Also, when the feature expansion module 90 is installed in a host device 1 such as a mobile phone, computer or the like having a data communications function and sends the latitude and longitude information to the host device 1 via the S-P/P-S interface 49, the host device 1 can send the latitude and longitude information to any other mobile phone or computer.

Also, the controller 9 sends the latitude and longitude information, for storage, to the memory chip 27 set in the recess 22 via the chip interfaces 50 and 51.

The feature expansion module 90 constructed as above can have an increased storage capacity just by replacing the memory chip 27 with any other larger-capacity one even when the position data such as the latitude and longitude information is too large in size for storage into the memory chip 27.

Also, the feature expansion module 90 can avoid a mixture of video data of different kinds from being mixed in one memory chip by replacing the memory chip with another for each difference between position data in date, location or the like of positioning. Thus, the feature expansion module 90 can easily manage data.

Having the receiver 93 installed in the feature expansion module 90 having the memory chip 27 already set therein, the feature expansion module 90 can function as a GPS receiver independently of the host device 1. Since the memory chip 27 and positioning computation controller 94 are formed inside the housing 11 of the feature expansion module 90, it is possible to design the housing 93a of the receiver 93 compact and lightweight, and thus improve the portability.

Further, by installing the feature expansion module 90 with the receiver 93 removed therefrom in the host device 1 with the image display, the feature expansion module 90 can send the latitude and longitude information to the host device 1 and display the present position thereof on the image display of the host device 1. That is, the feature expansion module 90 can also be used as a module to expand the function of the host device 1.

Also, since the feature expansion module 90 can receive, in the recess 22 thereof, an integrated circuit chip such as the memory chip 27 or the like not fitting the insertion slot 2 of the host device 1 for the feature expansion module 90, even an integrated circuit chip not complying with the standard applied to the insertion slot 2 can be connected to the host device 1.

Note that the feature expansion module 90 may have a recess 22 formed in the receiver 93 to receive an integrated circuit chip such as the memory chip 27 or the like.

Also note that although the feature expansion module having a single function according to the preset invention has been described in the foregoing, the present invention is not limited to this embodiment but the present invention is applicable to a feature expansion module having a plurality of functions.

Next, a feature expansion module 100 having a digital camera function installed therein will be described.

The feature expansion module 100 which will be explained herebelow is different from the feature expansion module 70 shown in FIG. 7 in that a memory chip installed in the module 100 itself is connectable to a host device and usable as an external storage for the host device. Also, when the memory chip is installed in the feature expansion module 100, either a camera function or a memory function will be recognized by the host device. That is, the memory chip installed in the feature expansion module 100 will not be used as a part of the camera function but it will be recognized as a memory by the host device.

Note that in the following, a memory chip installable in the feature expansion module 100 will be referred to as "compact memory card", a mode in which the feature expansion module 100 works as a camera will be referred to as "camera mode" and a mode in which the feature expansion module 100 works as a memory will be referred to as "memory mode".

Figure 9:
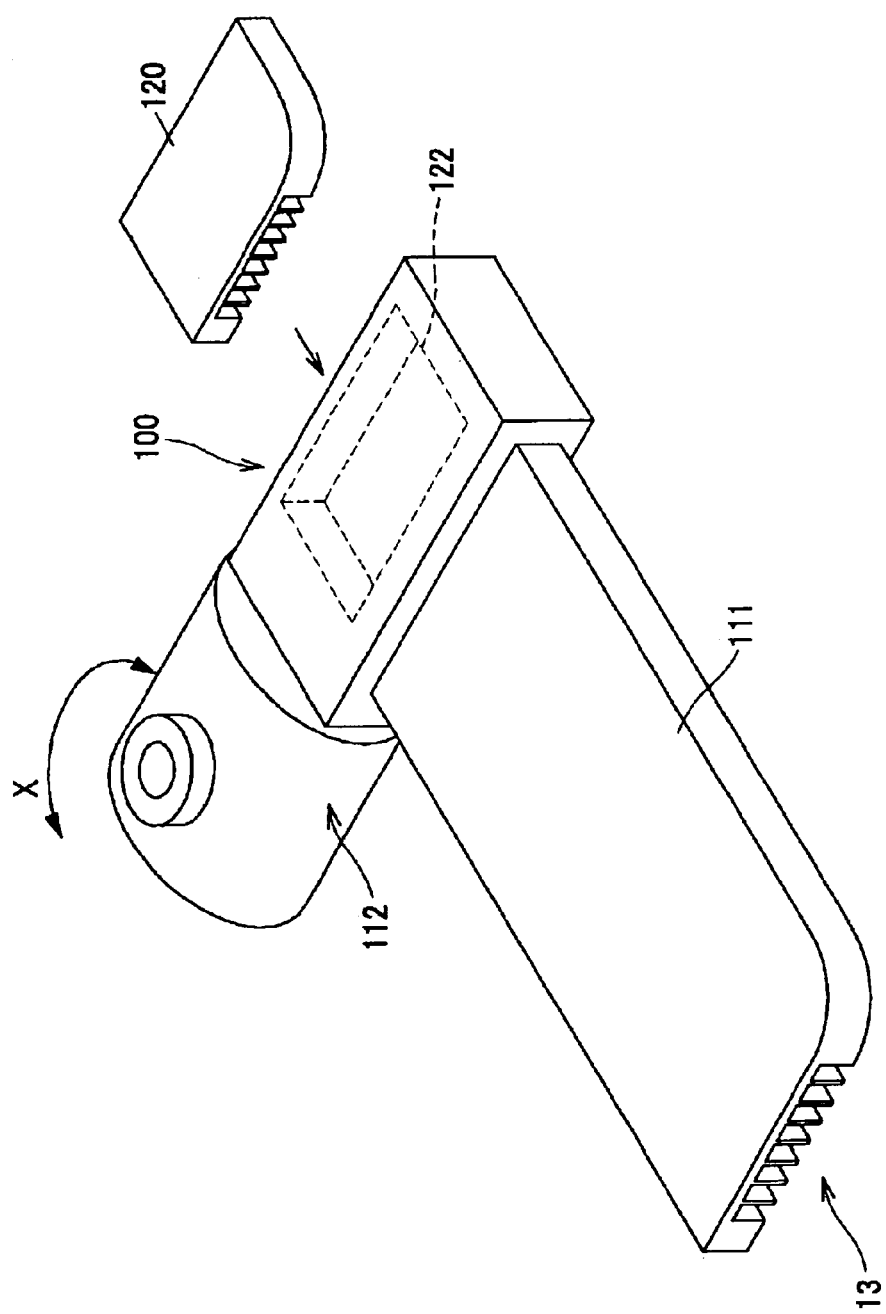
FIG. 9 is a perspective view of a camera module and compact memory card.

Referring now to FIG. 9, there is schematically illustrated in the form of perspective concept view the feature expansion module 100 and compact memory card 120 installable in the feature expansion module 100.

As shown in FIG. 9, the feature expansion module 100 is composed of an I/O module 111 and a camera module 112. The I/O module 111 is formed to have the same shape as the feature expansion module 10 having previously been described, and has provided at one end thereof the terminal block 13 for connection with a host device. The I/O module 111 has the camera module 112 provided at the end thereof opposite to the end where the terminal block 13 is provided. The camera module 112 includes a CCD image sensor, optical system, etc. The feature expansion module 100 has formed at the end thereof opposite to the terminal block 13 a slot 122 into which a compact memory card 120 is to be inserted. The compact memory card 120 is installed into the feature expansion module 100 through the slot 122.

The camera module 112 is rotatable in the direction of arrow X in FIG. 9 so that the lens can be directed freely.

Figure 10:
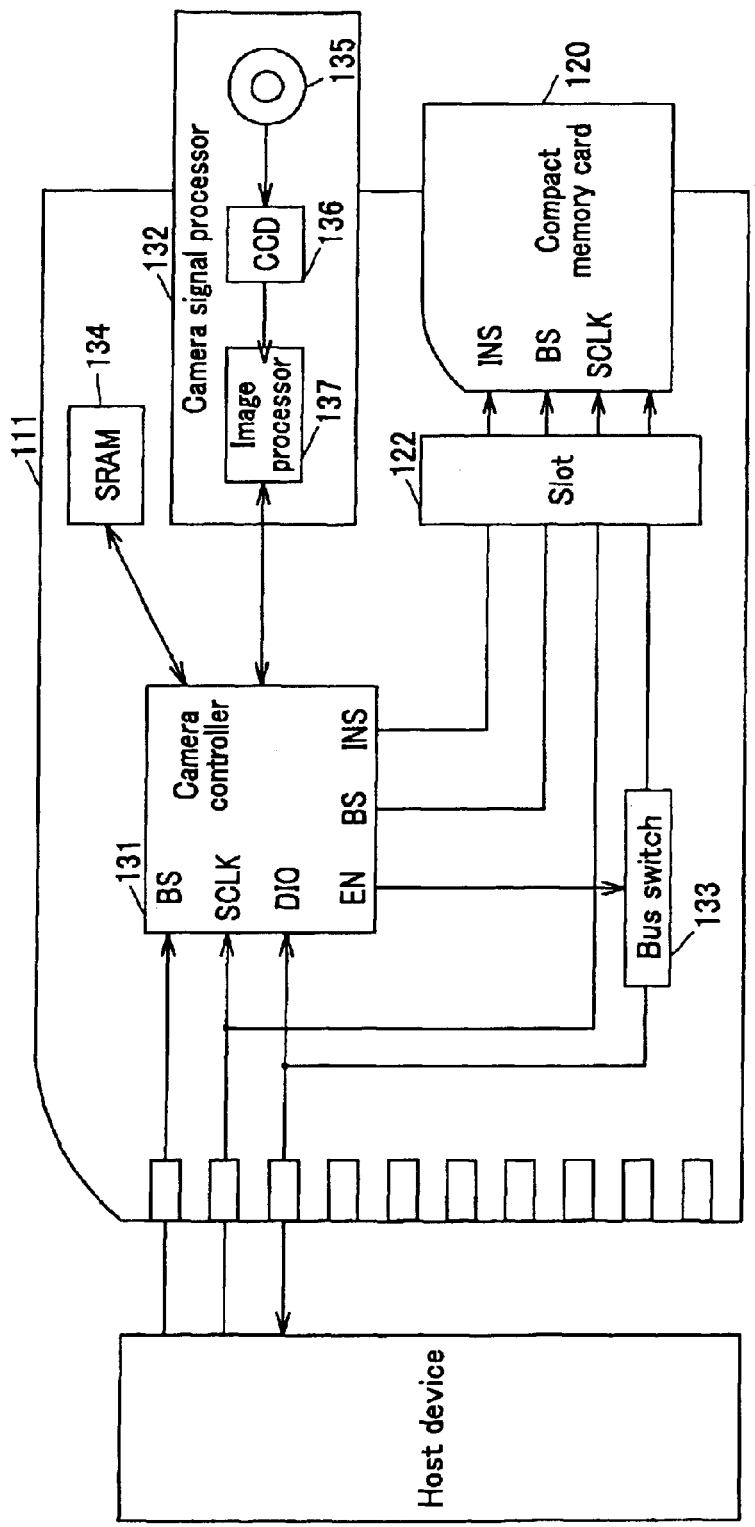
FIG. 10 is an internal block diagram of the camera module.

FIG. 10 is an internal block diagram of the feature expansion module 100.

As shown, the feature expansion module 100 includes a camera controller 131, camera signal processor 132, bus switch 133 and an SRAM 134. Also, the compact memory card 120 is inserted through the slot 122 and connected to the internal terminal block of the feature expansion module 100.

Using a three-wire half-duplex serial data transfer protocol using bus state BS, serial clock SCLK and serial data DIO, the camera controller 131 transfers data to and from the host device. Also, the camera controller 131 controls the operations of the camera signal processor 132.

The camera signal processor 132 has provided therein an optical system 135 including a lens etc., CCD image sensor 136 and an image processor 137. Being controlled by the camera controller 131, the camera signal processor 132 takes a picture of an object and transfers picture data thus captured to the SRAM 134.

The SRAM 134 is a memory to hold the picture data from the camera signal processor 132. The picture data from the camera signal processor 132 is stored once into the SRAM 134 via the camera controller 131. The picture data stored in the SRAM 134 is transferred to the host device via the camera controller 131 under a transfer command from the host device, for example. It should be noted that in the feature expansion module 100, picture data can forcibly be transferred from the camera signal processor 132 to the SRAM 134 either by giving an operation control command from the host device or by turning the camera block 112 by hand.

The compact memory card 120 uses the same data transfer protocol as that for data transfer between the camera controller 131 and host device to transfer data to and from the host device. It should be noted that the physical line of the interface between the compact memory card 120 and host device is connected to the host device via the bus switch 133 while a serial clock (SCLK) signal line is connected directly to the host device. The bus switch 133 is provided to connect and disconnect the connection line between the compact memory card 120 and host device. The connection establishment by the bus switch 133 is controlled by the camera controller 131. When the feature expansion module 100 is in the memory mode, the camera controller 131 controls the bus switch 133 to connect the serial data bus between the host device and compact memory card 120, while controlling the bus switch 133 not to connect the serial data bus between the host device and compact memory card 120 when the feature expansion module 100 is in the camera mode. The bus state BS signal is supplied from the camera controller 131 to the compact memory card 120.

Also, the compact memory card 120 has a connection terminal INS for detecting whether or not the compact memory card 120 is set in the feature expansion module 100. The connection terminal INS is connected to the camera controller 131. The camera controller 131 monitors the state of the connection line of the card setting detecting connection terminal INS to determine whether or not the compact memory card 120 is set in the feature expansion module 100.

Figure 11:
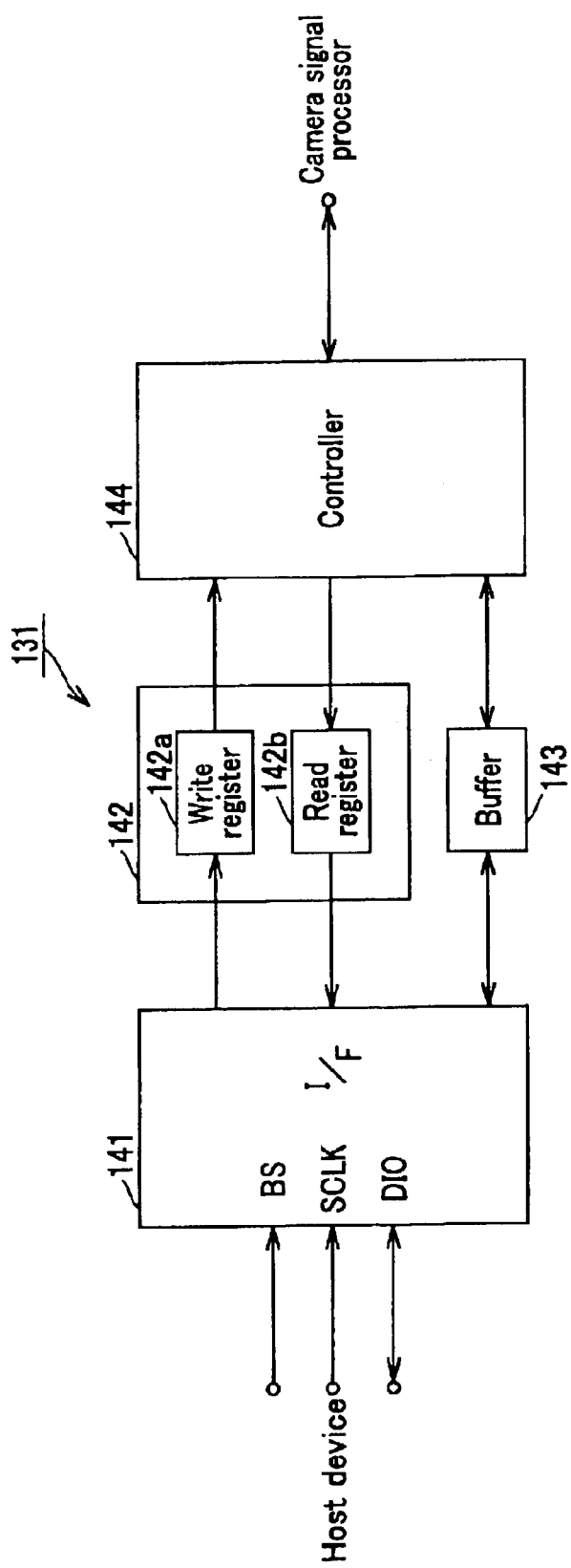
FIG. 11 is an internal block diagram of a camera controller provided inside the camera module.

FIG. 11 is an internal block diagram of the camera controller 131.

As shown in FIG. 11, the camera controller 131 includes an interface (I/F) circuit 141, register circuit 142, buffer circuit 143 and a controller 144.

The I/F circuit 141 uses the three-wire half-duplex parallel data transfer protocol to transfer data to and from the host device.

The register circuit 142 is provided to store, for example, an operation control command for the controller 144, transferred from the host device, internal state of the feature expansion module 100, various necessary parameters for execution of the operation control command, other parameters, etc. The register circuit 142 is accessed from both the host device and controller 144. For data write, the host device will access a write register 142a in the register circuit 142, and for data read, the host device will access a read register 142b. It should be noted that for access to the register circuit 142, the host device uses a transfer protocol command defined in the data transfer protocol for the feature expansion module 100. That is to say, to write or read data in response to an operation control command or any of various parameters stored in the register circuit 142, the host device will use the transfer protocol command.

The data buffer circuit 143 is provided to temporarily store, or buffer, picture data to be transferred to the host device.

In response to the operation control command transferred from the host device, the controller 144 controls the camera signal processor 132 and SRAM 134 and updates the data stored in the register circuit 142. It should be noted that under this interface protocol, the controller 144 controls operations of the camera signal processor 132 etc. after the operation control command is stored once into the register circuit 142.

Namely, for giving an operation control command to the camera controller 131, the host device should write the operation control command at a predetermined address in the register circuit 142 by executing the data transfer protocol. Once the operation control command is written at the predetermined address in the register circuit 142, the controller 144 will control the operation of the camera signal processor 132 etc. according to the content of the operation control command thus written in the register circuit 142.

Figure 12:
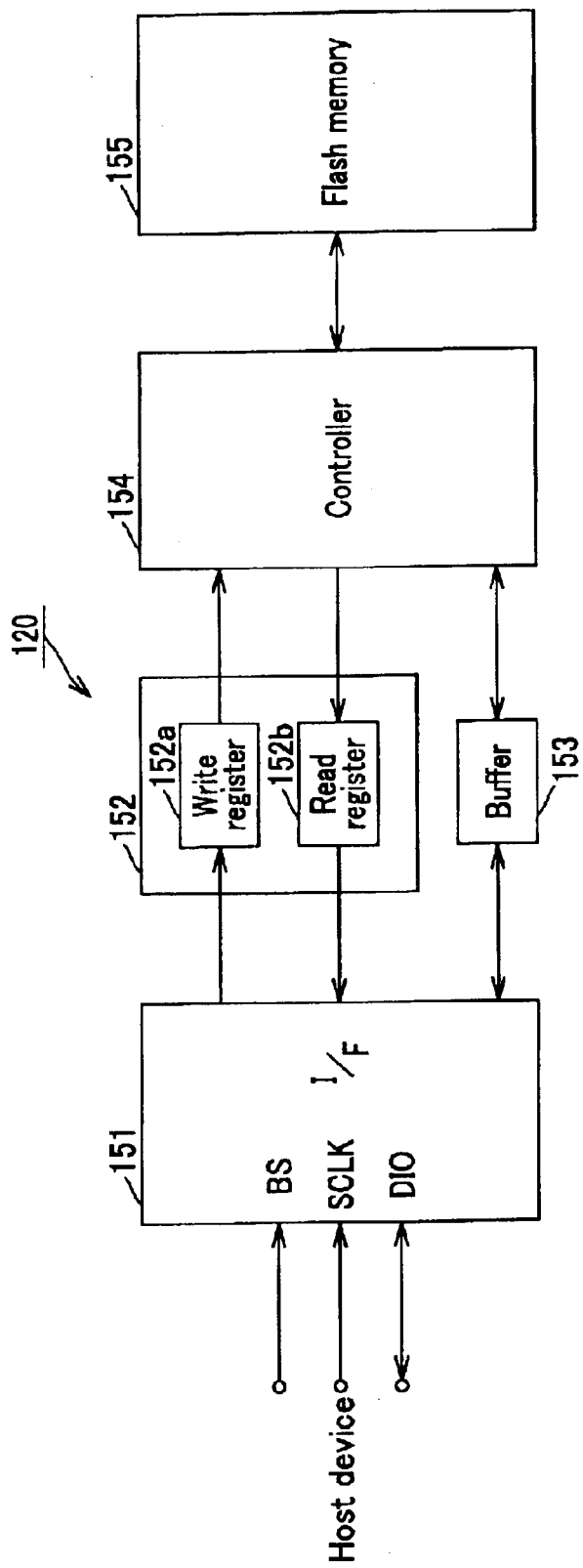
FIG. 12 is an internal block diagram of the compact memory card.

FIG. 12 is an internal block diagram of the compact memory card 120.

As shown, the compact memory card 120 includes an interface (I/F) circuit 151, register circuit 152, data buffer circuit 153, controller 154 and a flash memory 155.

The I/F circuit 151 uses the three-wire half-duplex parallel data transfer protocol to transfer data to and from the host device. The data transfer protocol for data transfer between the I/F circuit 151 and host device the same as that for the camera controller 131.

The register circuit 152 is provided to store, for example, an operation control command transferred from the host device, internal state of the compact memory card 120, various necessary parameters for execution of the operation control command, file management information etc. in the flash memory 155. The register circuit 152 is accessed from both the host device and controller 154. For data write, the host device will access a write register 152a in the register circuit 152, and for data read, the host device will access a read register 152b. For access to the register circuit 152, the host device will use the same transfer protocol command as that for the camera signal processor.

The data buffer circuit 153 is provided to temporarily store data to be written to the flash memory 155 and data read from the flash memory 155.

In response to the operation control command stored in the register circuit 152, the controller 154 controls the data transfer between the data buffer circuit 153 and flash memory 155 and functions of the compact memory card 120 and others, and updates the data stored in the register circuit 152.

The flash memory 155 is a nonvolatile semiconductor memory such as a NAND type flash memory or the like.

For giving an operation control command to the above compact memory card 120, the host device writes the operation control command into the register circuit 152 by executing the data transfer protocol. Once the operation control command is written in the register circuit 152, the controller 154 will control the operations of the flash memory etc. according to the content of the operation control command thus written in the register circuit 152.

Next, various types of registers used in the register circuit 142 of the camera controller 131 will be described.

The parameter content of the register circuit 142 is read from the host device in response to an operation control command called READ_REG, and written from the host device in response to an operation control command called WRITE_REG. It should be noted that under the READ_REG command, data is read from a read register 142b and under the WRITE_REG command, data is written to a write register 142a.

The register circuit 142 has provided therein a category register to which a parameter indicative of an operation mode of the feature expansion module 100 is recorded. The controller 144 switches the operation mode of the feature expansion module 100 to the camera mode or memory mode according to the data in the category register. When the feature expansion module 100 is in the camera mode, the controller 144 will put the camera signal processor 132 into a standby state while disconnecting the data bus between the compact memory card 120 and host device by turning off the bus switch 133. When the feature expansion module 100 is in the memory mode, the controller 144 will release the camera signal processor 132 from the standby state while connecting the data bus between the compact memory card 120 and host device by turning on the bus switch 133. The data in the category register is rewritable by the host device. Thus, the host device can control the operation mode of the feature expansion module 100.

Note that the register circuit 152 in the compact memory card 120 has also a category register provided therein. However, no value for the camera mode can be written to this category register in the compact memory card 120.

In the following, it is assumed that the value in the category register is 0x06 when the feature expansion module 100 is in the camera mode and 0x00 when the feature expansion module 100 is in the memory mode. Therefore, the value 0x00 or 0x06 is written to the category register in the camera controller 131. It should be noted that the value in the category register in the compact memory card 120 is fixed to 0x00. Also, when no compact memory card 120 is installed, the value in the category register in the camera controller 131 is fixed to 0x06.

Also, the register circuit 142 has provided therein a camera or picture inversion register in which there is stored a parameter indicating whether or not picture data stored in the SRAM 134 is to be inverted for transfer to the host device. Since the camera module 112 of the feature expansion module 100 is freely rotatable, when the camera module 112 is rotated 180 degrees from the home (reference) position, a picture appears inverted vertically or horizontally with respect to the home position. The controller 144 determines the rotated position of the camera module 112 and change in value the parameter in the camera inversion register depending upon whether the camera module 112 is in the normal position or in the inverted position. For transfer of picture data from the SRAM 134 to the host device, the controller 144 will invert the picture data depending upon the parameter value in the camera inversion register.

Also, the register circuit 142 has provided therein a card setting register in which there is stored a parameter indicating whether or not the compact memory card 120 is set in the feature expansion module 100. The parameter is written to the card setting register by the controller 144. The controller 144 monitors the state of the connection line of the card setting detecting connection terminal INS of the compact memory card 120 to determine whether or not the compact memory card 120 is set in the feature expansion module 100, and renews the parameter value in the card setting register depending upon the result of determination.

Also, the register circuit 142 has provided therein a camera control register in which there is stored a parameter for controlling whether or not transfer of picture data from the camera signal processor 132 to the SRAM 134 is to be allowed. The controller 144 transfers the picture data from the camera signal processor 132 to the SRAM 134 by making reference to the parameter value in the camera control register.

Next, how the operation mode of the feature expansion module 100 is switched will be explained.

Figure 13:
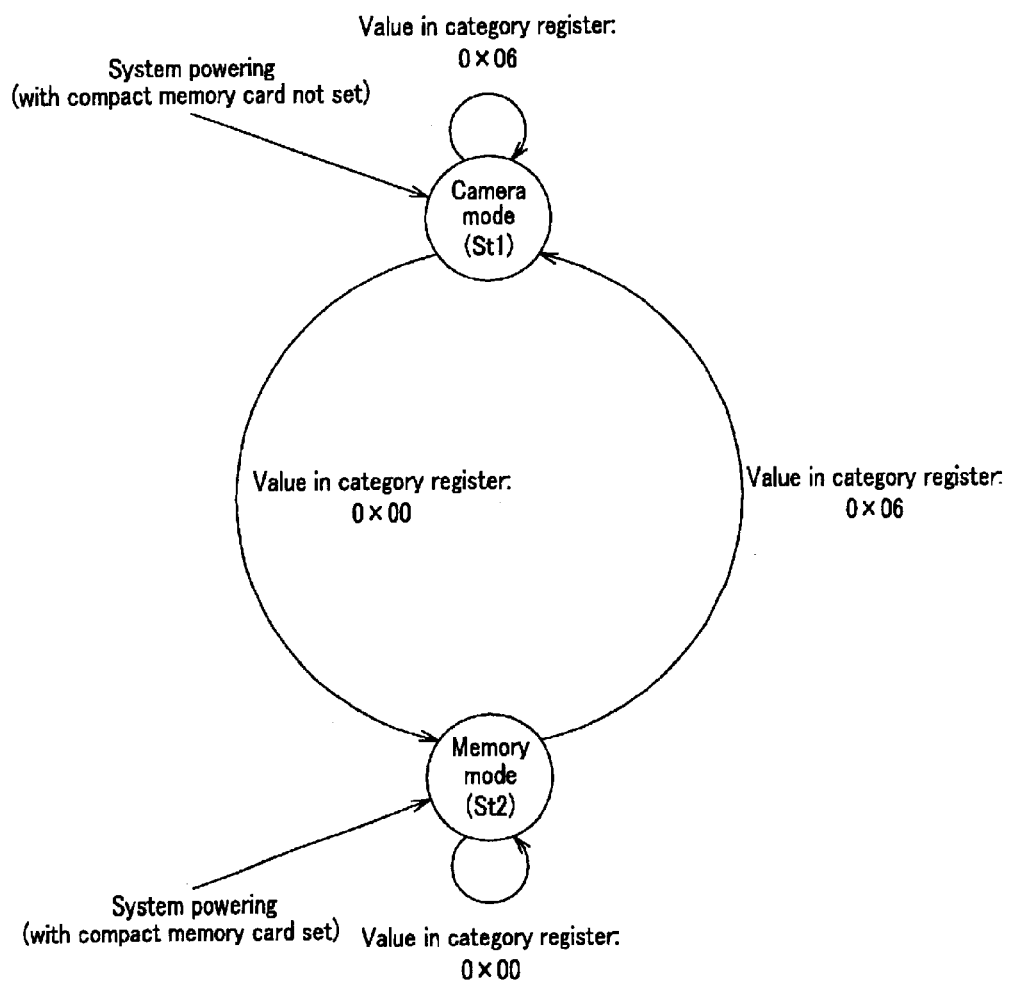
FIG. 13 is a state transition diagram showing the mode switching of the camera module.

FIG. 13 is a state transition diagram showing the mode switching of the feature expansion module 100.

Just after the system is powered, the feature expansion module 100 will detect the parameter value in the card setting register of the register circuit 142 to determine whether or not the compact memory card 120 is set in the feature expansion module 100. When it is determined that the compact memory card 120 is set, the feature expansion module 100 shifts to the memory mode (St2). If the compact memory card 120 is not set, the feature expansion module 100 will shift the camera mode (St1).

After the systerm powering, the feature expansion module 100 will monitor the value in the category register and shift the mode of operation to either the camera or memory mode. When the value in the category register is found changed to 0x06 (camera mode) for example, the feature expansion module 100 shifts to the camera mode (St 1). On the contrary, when the value is changed to 0x00 (memory mode), the feature expansion module 100 shifts to the memory mode (St2).

Note that still after the system powering, the feature expansion module 100 will continuously monitor the parameter value in the card setting register and if the compact memory card 120 is forcibly removed from the feature expansion module 100, the latter will forcibly be shifted to the camera mode.

Figure 14:
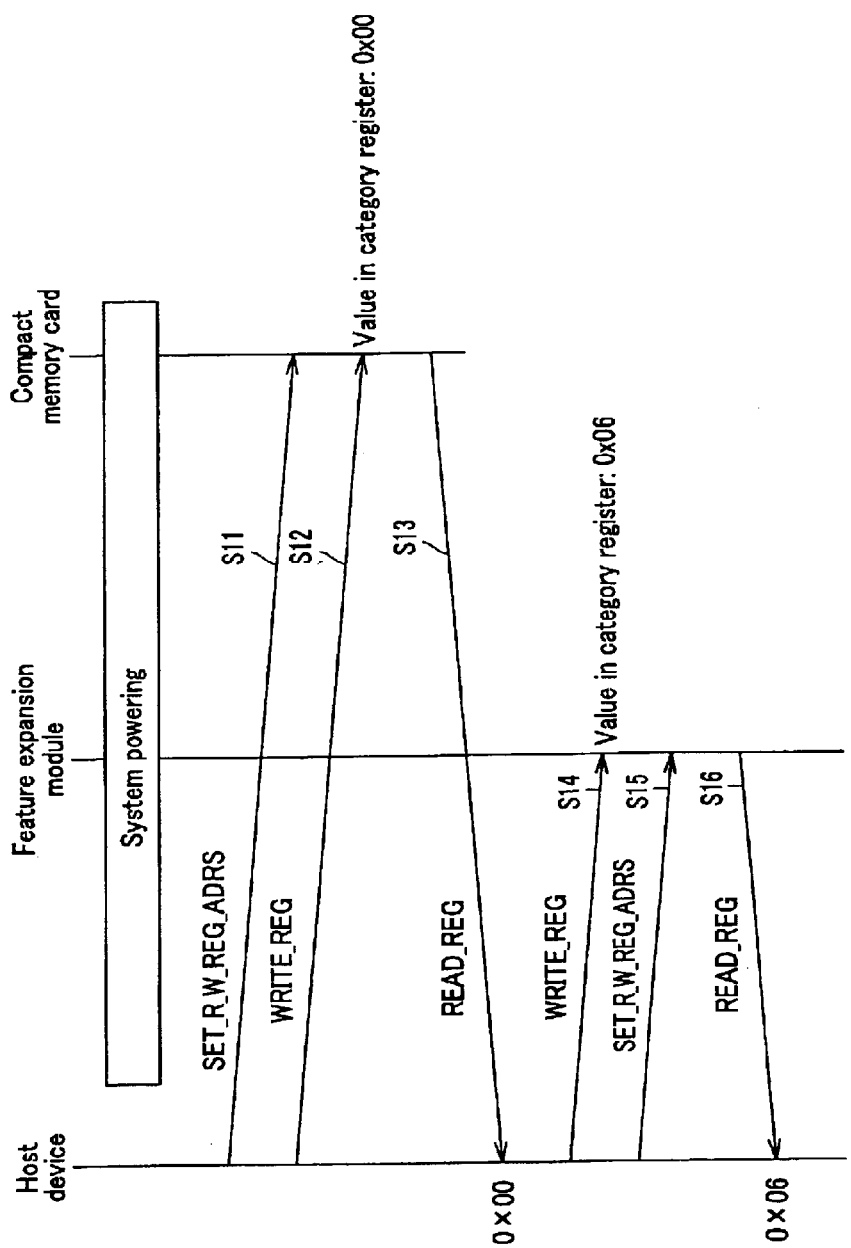
FIG. 14 shows a start-up sequence of the camera module having the compact card memory set therein.

Next, the start-up sequence after powering the system with the compact memory card 120 set in the feature expansion module 100 will be explained with reference to FIG. 14. It should be noted that a SET_R_W_REG_ADRS command used in the startup sequence which will be described below is a command for specifying an address in the register circuit to which access is made according to the READ_REG and WRITE_REG commands.

When the system is powered, the host device will send a SET_R_W_REG_ADRS command for specifying an address in the category register to the feature expansion module 100 (in step S11). The SET_R_W_REG_ADRS command thus received by the feature expansion module 100 is given to the register circuit of the camera controller 131. Next, for writing a value 0x00 to the category register in the write register 142a, the host device will send a WRITE_REG command to the feature expansion module 100 (in step S12). The WRITE_REG command thus received by the feature expansion module 100 is given to the category register in the write register 142a of the camera controller 131 and the value 0x00 will be written to the category register. When the value 0x00 has thus been written to the category register of the write register 142a, the controller 144 in the camera controller 131 will determine whether or not the compact memory card 120 is set in place. Since the compact memory card 120 is already set as mentioned above, the value 0x00 will be written to the category register in the read register 142*b*. Then, the host device will send a READ_REG command to the feature expansion module 100 and receive in return the value 0x00 from the category register of the read register 142*b* (in step S13).

Once the value 0x00 is written to the category register as above, the feature expansion module 100 will operate in the memory mode.

Next, for writing a value 0x06 to the category register, the host device will send a WRITE_REG command to the feature expansion module 100 (in step S14). The WRITE_REG command thus received by the feature expansion module 100 is given to the category register in the write register 142*a* of the camera controller 131 and the value 0x06 is written to the category register. After the value 0x06 is thus written to the category register of the write register 142*a*, the controller 144 in the camera controller 131 will write the value 0x06 to the category register of the read register 142*b*. Then, the host device will send a SET_R_W_REG_ADRS command for specifying an address in the category register to the feature expansion module 100 (in step S15). The SET_R_W_REG_ADRS command thus received by the feature expansion module 100 is given to the register circuit of the camera controller 131. Next, the host device will send a READ_REG command to the feature expansion module 100, and receive in return the value 0x06 from the category register in the read register 142*b* (in step S16).

With the value 0x06 written to the category register as above, the feature expansion module 100 will shift from the memory mode to the camera mode.

Figure 15:
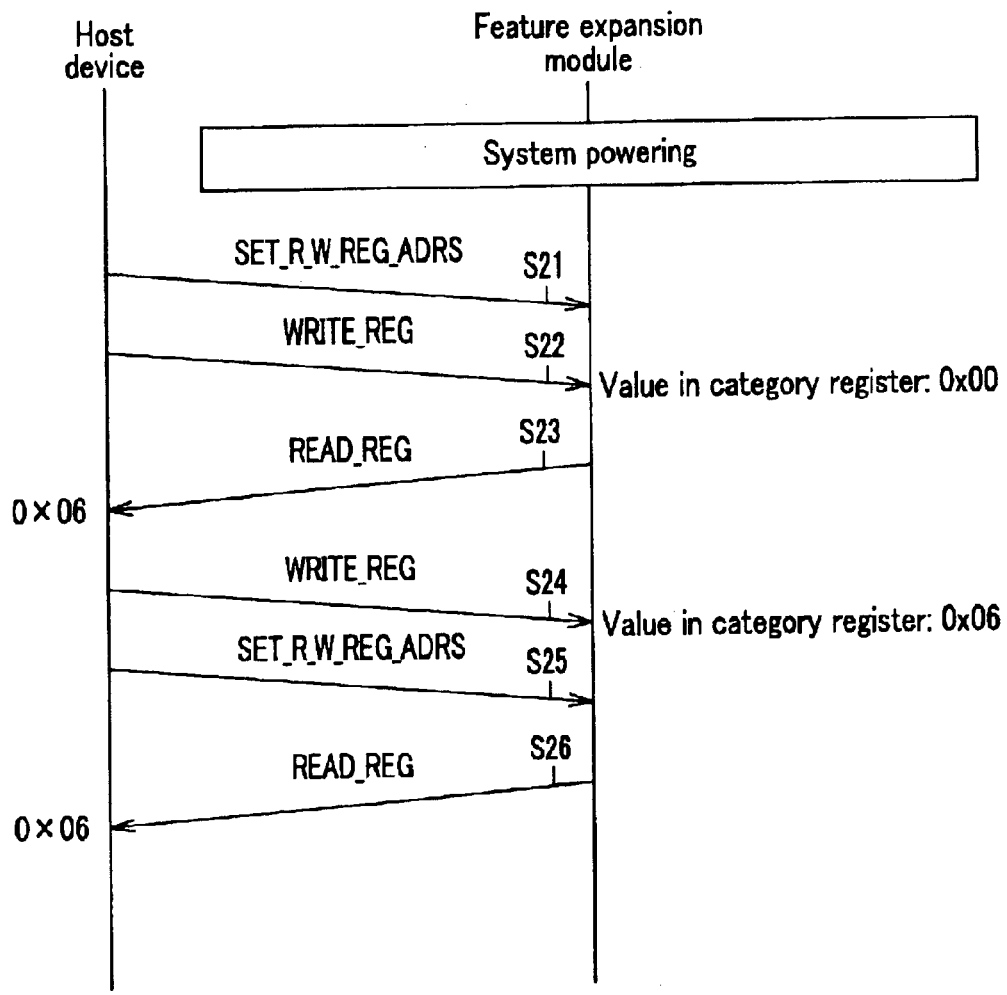
FIG. 15 shows a start-up sequence of the camera module having no compact memory card set therein.

Next, the start-up sequence after powering the system with no compact memory card 120 set in the feature expansion module 100 will be explained with reference to FIG. 15.

When the system is powered, the host device will send a SET_R_W_REG_ADRS command for specifying an address in the category register to the feature expansion module 100 (in step S21). The SET_R_W_REG_ADRS command thus received by the feature expansion module 100 is given to the register circuit of the camera controller 131. Next, for writing a value 0x00 to the category register in the write register 142*a*, the host device will send a WRITE_REG command to the feature expansion module 100 (in step S22). The WRITE_REG command thus received by the feature expansion module 100 is given to the category register in the write register 142*a* of the camera controller 131 and the value 0x00 will be written to the category register. When the value 0x00 has thus been written to the category register of the write register 142*a*, the controller 144 in the camera controller 131 will determine whether or not the compact memory card 120 is set in place. Since no compact memory card 120 is set as mentioned above, a value 0x06 will be written to the category register in the read register 142*b*. Then, the host device will send a READ_REG command to the feature expansion module 100 and receive in return the value 0x06 from the category register of the read register 142*b* (in step S23).

Next, for writing a value 0x06 to the category register, the host device will send a WRITE_REG command to the feature expansion module 100 (in step S24). The WRITE_REG command thus received by the feature expansion module 100 is given to the category register in the write register 142*a* of the camera controller 131 and the value 0x06 is written to the category register. After the value 0x06 is thus written to the category register of the write register 142*a*, the controller 144 in the camera controller 131 will write the value 0x06 to the category register of the read register 142*b*. Then, the host device will send a SET_R_W_REG_ADRS command for specifying an address in the category register to the feature expansion module 100 (in step S25). The SET_R_W_REG_ADRS command thus received by the feature expansion module 100 is given to the register circuit of the camera controller 131. Next, the host device will send a READ_REG command to the feature expansion module 100, and receive in return the value 0x06 from the category register in the read register 142*b* (in step S26).

Figure 16:
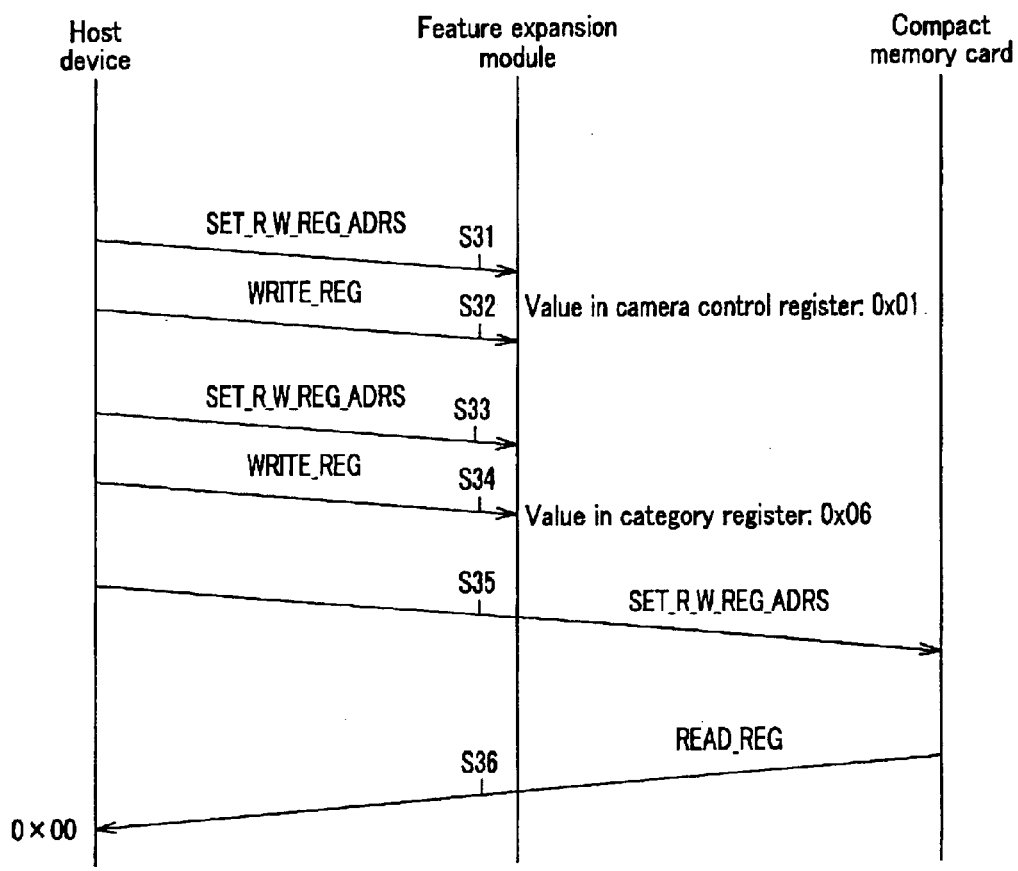
FIG. 16 shows a state-transition sequence in which the camera module shifts from a camera mode to memory mode.

Next, the sequence of transition from the camera mode to the memory mode will be described with reference to FIG. 16.

The host device will send a SET_R_W_REG_ADRS command for specifying an address in the camera control register to the feature expansion module 100 (in step S31). The SET_R_W_REG_ADRS command thus received by the feature expansion module 100 is given to the register circuit of the camera controller 131. Next, for writing a value 0x01 to the camera control register in the write register 142*a*, the host device will send a WRITE_REG command to the feature expansion module 100 (in step S32). The WRITE_REG command thus received by the feature expansion module 100 is given to the camera control register in the write register 142*a* and the value 0x01 will be written to the camera control register. When the value 0x01 has thus been written to the camera control register, the picture data transfer from the camera signal processor 132 to the SRAM 134 will be interrupted.

Next, the host device will send a SET_R_W_REG_ADRS command for specifying an address in the category register to the feature expansion module 100 (in step S33). The SET_R_W_REG_ADRS command thus received by the feature expansion module 100 is given to the register circuit of the camera controller 131. Next, for writing a value 0x00 to the category register in the write register 142*a*, the host device will send a WRITE_REG command to the feature expansion module 100 (in step S34). The WRITE_REG command thus received by the feature expansion module 100 is given to the category register in the write register 142*a* of the camera controller 131 and the value 0x00 will be written to the category register. When the value 0x00 has thus been written to the category register of the write register 142*a*, the controller 144 in the camera controller 131 will determine whether or not the compact memory card 120 is set in place. Since the compact memory card 120 is already set, the value 0x00 will be written to the category register in the read register 142*b*. Then, the camera controller 131 will shift the mode of operation to the memory mode.

Then, the host device will send a SET_R_W_REG_ADRS command for specifying an address in the category register to the feature expansion module 100 (in step S35). The SET_R_W_REG_ADRS command thus received by the feature expansion module 100 is given to the register circuit of the compact memory card 120. Next, the host device will send a READ_REG command to the feature expansion module 100, and receive in return the value 0x00 from the category register in the compact memory card 120 (in step S36).

With the value 0x00 written to the category register as above, the feature expansion module 100 will shift from the camera mode to the memory mode.

Figure 17:
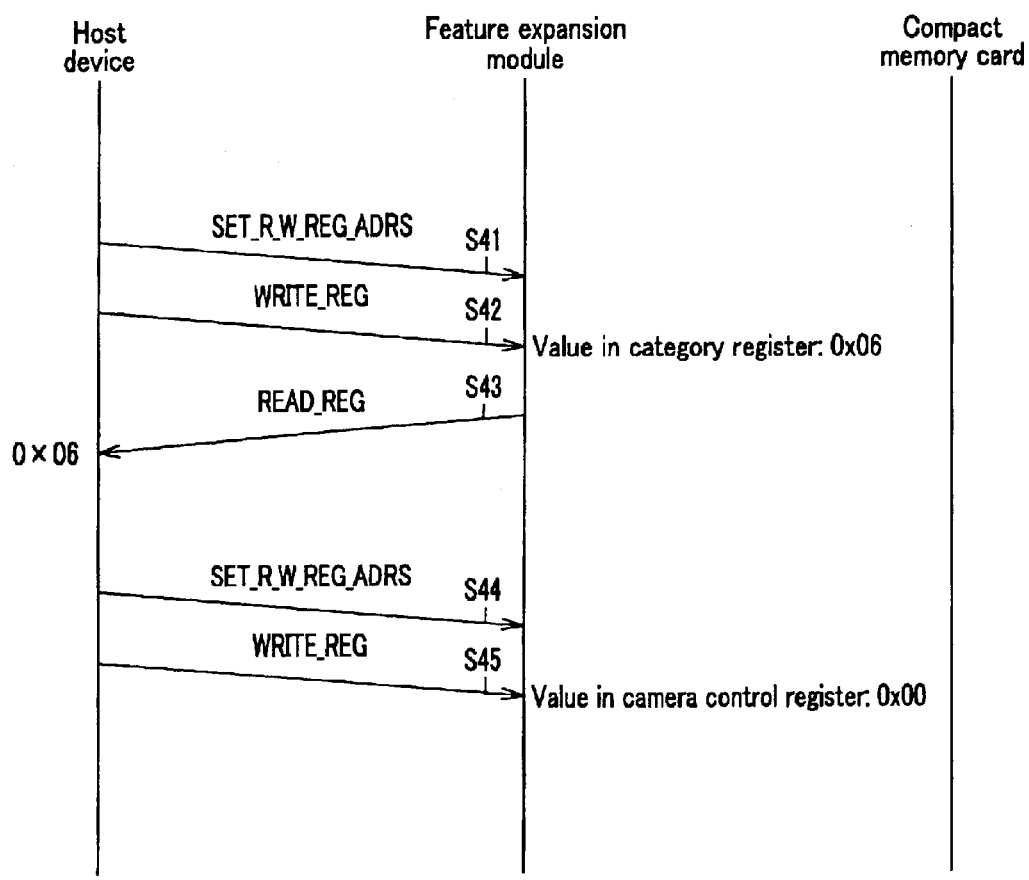
FIG. 17 shows a state-transition sequence in which the camera module shifts from the memory mode to camera mode.

Next, the sequence of transition from the memory mode to the camera mode will be described with reference to FIG. 17.

The host device will send a SET_R_W_REG_ADRS command for specifying an address in the camera control register to the feature expansion module 100 (in step S41). The SET_R_W_REG_ADRS command thus received by the feature expansion module 100 is given to the register circuit of the camera controller 131. Next, for writing a value 0×06 to the write register 142*a* in the register circuit, the host device will send a WRITE_REG command to the feature expansion module 100 (in step S42). The WRITE_REG command thus received by the feature expansion module 100 is given to the category register in the write register 142*a* of the camera controller 131. After the value 0×06 is written to the category register in the write register 142*a*, the controller 144 in the camera controller 131 will write the value 0×06 to the category register in the read register 142*b*. Then, the host device will send a READ_REG command to the feature expansion module 100 and receive in return the value 0×06 from the category register in the read register 142*b* (in step S43). When the value 0×06 has thus been written to the category register, the feature expansion module 100 will shift to the camera mode.

Next, the host device will send a SET_R_W_REG_ADRS command for specifying an address in the camera control register to the feature expansion module 100 (in step S44). The SET_R_W_REG_ADRS command thus received by the feature expansion module 100 is given to the register circuit of the camera controller 131. Next, the host device will send a WRITE_REG command to the feature expansion module 100 and a value 0×01 will be stored into the camera control register in the write register 142*a* of the camera controller 131 (in step S45).

Industrial Applicability

As having been described in the foregoing, the present invention provides a feature expansion module designed to have the storage capacity thereof increased by replacing the integrated circuit chip with a larger-capacity one. Namely, even if the memory capacity of the feature expansion module being used becomes insufficient, it can be increased just by replacing the integrated circuit chip with another without having to use any fresh feature expansion module or transfer data to a host computer.

Also, the feature expansion module according to the present invention can be used with a more appropriate one selected from available integrated circuit chips for data being handled, and thus data can easily be managed with the feature expansion module.

Further, since the feature expansion module according to the present invention has a control circuit for an auxiliary module provided in the housing thereof, an auxiliary module to be installed at one end of the housing can be designed compact and lightweight, which will greatly contribute to an improved portability.

Moreover, since in the feature expansion module according to the present invention, a recess is designed to receive therein an integrated circuit chip not fitting an insertion slot formed in a host device for the feature expansion module, an integrated circuit chip not complying with a standard applied to the insertion slot can be connected to the host device.

What is claimed is:

1. A feature expansion module comprising:
   a generally rectangular body installable in a host device;
   a first connection terminal provided at one side of the body to electrically be connected to the host device;
   a feature expansion unit formed in the body and having one or more functions;
   one or more recesses, formed contiguously to an insertion slot formed at the other side of the body and through which an integrated circuit chip incorporating integrated circuit elements is to be inserted, to receive the integrated circuit chip;
   a second connection terminal provided in the recess to electrically be connected to a group of terminals provided on the integrated circuit chip; and
   a controller incorporated in the body to control the integrated circuit chip set in the recess.

2. The feature expansion module as set forth in claim 1, wherein the integrated circuit chip is a memory chip including memory elements.

3. The feature expansion module as set forth in claim 1, wherein an auxiliary module to implement one or more functions is installed in the body.

4. The feature expansion module as set forth in claim 3, wherein the auxiliary module includes:
   a recess in which the integrated circuit chip is to be set; and
   a connection terminal provided in the recess for electrical connection to a group of terminals provided on the integrated circuit chip.

5. A feature expansion module comprising:
   a generally rectangular body installable in a host device;
   one or more integrated circuit chips including an internal integrated circuit element;
   a first connection terminal provided at one side of the body to electrically be connected to the host device;
   a feature expansion unit formed in the body and having one or more functions;
   one or more recesses, formed contiguously to an insertion slot formed at the other side of the body and through which the integrated circuit chip incorporating the integrated circuit element is to be inserted, to receive the integrated circuit chip;
   a second connection terminal provided in the recess to electrically be connected to a group of terminals provided on the integrated circuit chip; and
   a controller incorporated in the body to control the integrated circuit chip set in the recess.

6. The feature expansion module as set forth in claim 5, wherein the integrated circuit chip is a memory chip including memory elements.

7. The feature expansion module as set forth in claim 5, wherein an auxiliary module to implement one or more functions is installed in the body.

8. The feature expansion module as set forth in claim 7, wherein the auxiliary module includes:
   a recess in which the integrated circuit chip is to be set; and
   a connection terminal provided in the recess for electrical connection to a group of terminals provided on the integrated circuit chip.

9. A feature expansion module comprising:
   a generally rectangular body installable in a host device;
   a connection terminal provided at one side of the body for electrical connection to the host device;
   a feature expansion unit formed in the body and having a predetermined function;
   a first interface to control data transfer between the host device and feature expansion unit via the connection terminal;
   a memory card connector provided at the other side of the body for electrical connection of a memory card; and
   a bus for electrical connection with the host device via the memory card connected to the memory card connector and connection terminal;
   the feature expansion unit making data transfer to and from the host device when it is set in a first mode while allowing data transfer between the memory card and host device when in a second mode.

* * * * *